(12) United States Patent
Chiu

(10) Patent No.: US 12,349,338 B2
(45) Date of Patent: Jul. 1, 2025

(54) MEMORY DEVICE HAVING IMPROVED P-N JUNCTION AND MANUFACTURING METHOD THEREOF

(71) Applicant: NANYA TECHNOLOGY CORPORATION, New Taipei (TW)

(72) Inventor: Hsih-Yang Chiu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 373 days.

(21) Appl. No.: 18/097,338

(22) Filed: Jan. 16, 2023

(65) Prior Publication Data

US 2024/0244827 A1 Jul. 18, 2024

(51) Int. Cl.
H10B 12/00 (2023.01)

(52) U.S. Cl.
CPC ........... H10B 12/34 (2023.02); H10B 12/053 (2023.02); H10B 12/315 (2023.02)

(58) Field of Classification Search
CPC .... H10B 12/34; H10B 12/053; H10B 12/315; H10B 12/48; H01L 23/5283; H01L 23/5329
See application file for complete search history.

(56) References Cited

U.S. PATENT DOCUMENTS 10,886,406 B1 * 1/2021 Lin ..................... H10B 12/053
2022/0406789 A1 12/2022 Jeon et al.

FOREIGN PATENT DOCUMENTS

| TW | 202107713 A | 2/2021 |
| TW | 202247428 A | 12/2022 |
| TW | 202316578 A | 4/2023 |

OTHER PUBLICATIONS

Office Action and and the search report mailed on Mar. 25, 2024 related to Taiwanese Application No. 112119579.
Office Action and and the search report mailed on Apr. 19, 2024 related to Taiwanese Application No. 113104442.

* cited by examiner

*Primary Examiner* — Shih Tsun A Chou
*Assistant Examiner* — Jonathan Keith Little
(74) *Attorney, Agent, or Firm* — Xuan Zhang

(57) ABSTRACT

The present application provides a memory device including a semiconductor substrate having a first surface and defined with an active area under the first surface; a gate structure adjacent to the active area and indented into the semiconductor substrate from the first surface; a doped member extending into the semiconductor substrate and surrounded by the active area; a conductive layer including a first portion extending into the semiconductor substrate from the first surface and a second portion disposed over the doped member and coupled to the first portion; and a first insulating layer disposed adjacent to the first portion of the conductive layer and between the doped member and the active area of the semiconductor substrate, wherein the first portion of the conductive layer is disposed between the gate structure and the doped member. A method of manufacturing the memory device is also disclosed.

20 Claims, 21 Drawing Sheets

MEMORY DEVICE HAVING IMPROVED P-N JUNCTION AND MANUFACTURING METHOD THEREOF

TECHNICAL FIELD

The present disclosure relates to a memory device and a manufacturing method thereof, and more particularly, to a memory device having an insulating layer and a conductive layer corresponding to the insulating layer to form a channeled P-N junction, and a manufacturing method of the memory device.

DISCUSSION OF THE BACKGROUND

Dynamic random-access memory (DRAM) is a type of semiconductor arrangement for storing bits of data in separate capacitors within an integrated circuit (IC). DRAMs are commonly formed as trench capacitor DRAM cells. An advanced method of fabricating a buried gate electrode involves building a gate electrode of a transistor and a word line in a trench in an active area (AA) comprising a shallow trench isolation (STI) structure.

Over the past few decades, as semiconductor fabrication technology has continuously improved, sizes of electronic devices have been correspondingly reduced. As a size of a P-N junction is reduced to a few nanometers in length, an undesired conduction within the P-N junction may significantly decrease performance of the DRAM. It is therefore desirable to avoid P-N junction leakage.

SUMMARY

One aspect of the present disclosure provides a memory device. The memory device includes a semiconductor substrate having a first surface and defined with an active area under the first surface; a gate structure adjacent to the active area and indented into the semiconductor substrate from the first surface; a doped member extending into the semiconductor substrate and surrounded by the active area; a conductive layer including a first portion extending into the semiconductor substrate from the first surface and a second portion disposed over the doped member and coupled to the first portion; and a first insulating layer disposed adjacent to the first portion of the conductive layer and between the doped member and the active area of the semiconductor substrate, wherein the first portion of the conductive layer is disposed between the gate structure and the doped member.

Another aspect of the present disclosure provides a memory device. The memory device includes a semiconductor substrate having a first surface and defined with an active area under the first surface; a gate structure adjacent to the active area and indented into the semiconductor substrate from the first surface; an insulating layer disposed within the active area; and a conductive layer including a first portion extending into the active area and a second portion disposed over the insulating layer and the active area, wherein the first portion is coupled to and extends from the second portion, and the first portion contacts the insulating layer and the active area.

Another aspect of the present disclosure provides a method of manufacturing a memory device. The method includes steps of providing a semiconductor substrate defined with an active area, wherein the semiconductor substrate includes a gate structure adjacent to the active area and an isolation structure surrounding the active area and the gate structure; forming a recess extending into the semiconductor substrate and within the active area; and forming an insulating layer conformal to the recess. The method further includes removing a portion of the insulating layer to expose a first side of the recess, wherein the first side of the recess is adjacent to the gate structure; forming a first portion of a conductive layer on the first side of the recess; forming a doped member within the recess and over the insulating layer and the first portion of the conductive layer; and forming a second portion of the conductive layer over the doped member and coupled to the first portion of the conductive layer.

In conclusion, because an insulating layer disposed between a doped member and an active area of a semiconductor substrate is coupled to a conductive layer adjacent to a gate structure and over the doped member, leakage from a P-N junction may be avoided. Therefore, an overall performance of a memory device and a process of manufacturing the memory device are improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
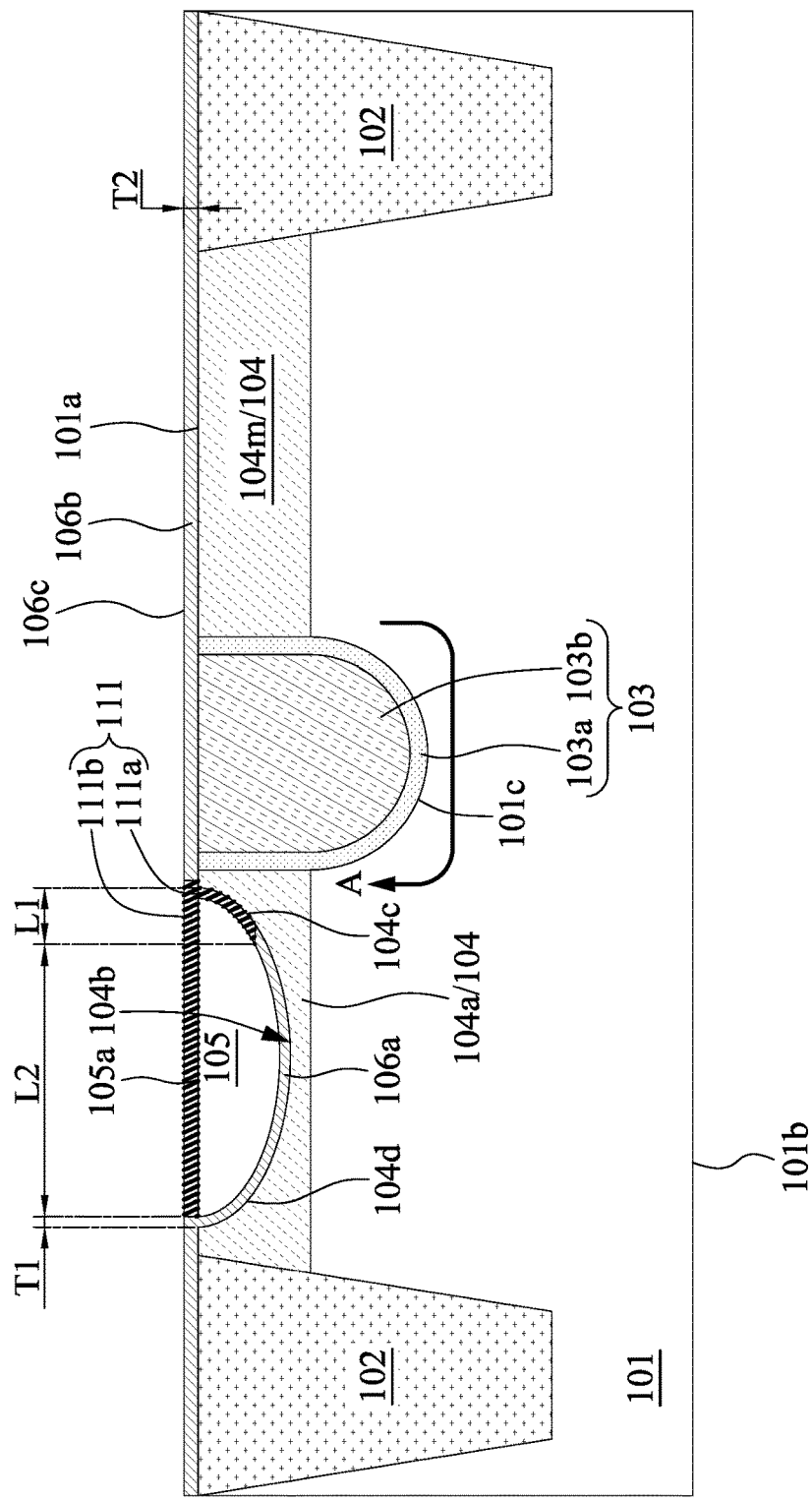
FIG. 1 is a cross-sectional side view of a memory device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic cross-sectional side view of a first memory device 100 in accordance with some embodiments of the present disclosure. In some embodiments, the first memory device 100 includes several unit cells.

In some embodiments, the first memory device 100 includes a semiconductor substrate 101. In some embodiments, the semiconductor substrate 101 includes semiconductive material such as silicon, germanium, gallium, arsenic, or a combination thereof. In some embodiments, the semiconductor substrate 101 includes bulk semiconductor material. In some embodiments, the semiconductor substrate 101 is a semiconductor wafer (e.g., a silicon wafer) or a semiconductor-on-insulator (SOI) wafer (e.g., a silicon-on-insulator wafer). In some embodiments, the semiconductor substrate 101 is a silicon substrate. In some embodiments, the semiconductor substrate 101 includes lightly-doped monocrystalline silicon. In some embodiments, the semiconductor substrate 101 is a p-type substrate.

In some embodiments, the semiconductor substrate 101 includes a first surface 101a and a second surface 101b opposite to the first surface 101a. In some embodiments, the first surface 101a is a front side of the semiconductor substrate 101, wherein electrical devices or components are subsequently formed over the first surface 101a and configured to electrically connect to an external circuitry. In some embodiments, the second surface 101b is a back side of the semiconductor substrate 101, where electrical devices or components are absent.

In some embodiments, the semiconductor substrate 101 includes several active areas (AA) 104 separated from each other. Each of the active areas 104 is a doped region in the semiconductor substrate 101. In some embodiments, each of the active area 104 extends horizontally over or under the first surface 101a of the semiconductor substrate 101. In some embodiments, each of the active areas 104 includes a same type of dopant. In some embodiments, each of the active areas 104 includes a type of dopant that is different from the types of dopants included in other active areas 104. In some embodiments, each of the active areas 104 has a same conductive type. In some embodiments, the active area 104 includes N-type dopants.

In some embodiments, the semiconductor substrate 101 includes a first recess 101c extending into the semiconductor substrate 101. In some embodiments, the first recess 101c extends from the first surface 101a toward the second surface 101b of the semiconductor substrate 101. In some embodiments, the first recess 101c is disposed between the active areas 104, such as between a first active area 104a and a second active area 104m. In some embodiments, the first recess 101c is tapered from the first surface 101a toward the second surface 101b of the semiconductor substrate 101. In some embodiments, a depth of the first recess 101c is substantially greater than a depth of is each of the active areas 104.

In some embodiments, the first memory device 100 includes a gate structure 103 disposed within the first recess 101c. In some embodiments, the gate structure 103 is disposed between the active areas 104, such as between the first active area 104a and the second active area 104m.

In some embodiments, the gate structure 103 includes a gate oxide 103a disposed within the first recess 101c, and a gate electrode 103b surrounded by the gate oxide 103a. In some embodiments, the gate oxide 103a is disposed conformal to and within the first recess 101c. In some embodiments, the gate oxide 103a is disposed along an entire sidewall of the first recess 101c. In some embodiments, the gate electrode 103b is conformal to the gate oxide 103a. In some embodiments, the gate oxide 103a includes silicon oxide, or the like. In some embodiments, the gate electrode 103b includes conductive material such as tungsten (W).

In some embodiments, the first memory device 100 further includes an isolation structure 102 adjacent to the gate structure 103. In some embodiments, the isolation structure 102 extends into the semiconductor substrate 101 from the first surface 101a toward the second surface 101b. In some embodiments, the isolation structure 102 is a shallow trench isolation (STI). In some embodiments, the isolation structure 102 defines a boundary of the active areas 104. In some embodiments, the semiconductor substrate 101 is defined with the active areas 104 and includes the isolation structure 102 surrounding the active areas 104 and the gate structure 103. In some embodiments, the isolation structure 102 is formed of an insulating material, such as silicon oxide, silicon nitride, silicon oxynitride, the like, or a combination thereof. In some embodiments, a depth of the isolation structure 102 is substantially greater than a depth of the gate structure 103.

In some embodiments, the semiconductor substrate 101 includes a second recess 104b extending into the semiconductor substrate 101. In some embodiments, the second recess 104b is adjacent to the gate structure 103. In some embodiments, the second recess 104b extends from the first surface 101a toward the second surface 101b of the semiconductor substrate 101. In some embodiments, the second recess 104b is tapered from the first surface 101a toward the second surface 101b of the semiconductor substrate 101. In some embodiments, the second recess 104b is disposed within one of the active areas 104, such as the first active area 104a. In some embodiments, the second recess 104b is disposed between the gate structure 103 and the isolation structure 102. In some embodiments, a depth of the second recess 104b is substantially equal to or less than the depth of the first recess 101c. In some embodiments, the depth of the second recess 104b is less than the depth of the first recess 101c. In some embodiments, the second recess 104b has a first side 104c adjacent to the gate structure 103 and a second side 104d opposite to the first side 104c.

In some embodiments, the first memory device 100 includes a first insulating layer 106a disposed within the second recess 104b. In some embodiments, the first side 104c of the second recess 104b is exposed through the first insulating layer 106a. In some embodiments, the first insulating layer 106a is conformal to the second side 104d of the second recess 104b. In some embodiments, the first insulating layer 106a is disposed within and surrounded by the first active area 104a. In some embodiments, the first insulating layer 106a is disposed within the first active area 104a and over the isolation structure 102 adjacent to the second recess 104b. In some embodiments, the first insulating layer 106a includes oxide. In some embodiments, the first insulating layer 106a includes silicon oxide, or the like.

In some embodiments, the first memory device 100 includes a doped member 105 extending into the semiconductor substrate 101 and surrounded by the first active area 104a. In some embodiments, the doped member 105 is disposed within the second recess 104b. In some embodiments, the doped member 105 is disposed over the first insulating layer 106a. In some embodiments, the first insulating layer 106a is disposed under the doped member 105 and surrounded by the first active area 104a. In some embodiments, the doped member 105 is disposed between the isolation structure 102 and the gate structure 103.

In some embodiments, the doped member 105 includes polycrystalline silicon (polysilicon). In some embodiments, the doped member 105 includes a type of dopant that is same as the types of dopants included in the active areas 104. In some embodiments, the doped member 105 includes N-type dopants.

In some embodiments, the first memory device 100 includes a conductive layer 111. In some embodiments, the conductive layer 111 is disposed over the first active area 104a. In some embodiments, the conductive layer 111 covers the first active area 104a. In some embodiments, the conductive layer 111 is disposed between the gate structure 103 and the isolation structure 102. In some embodiments, the conductive layer 111 is disposed over the doped member 105. In some embodiments, the doped member 105 is surrounded by the first insulating layer 106a and the conductive layer 111. In some embodiments, the conductive layer 111 includes conductive material, such as metal or alloy. In some embodiments, the conductive layer 111 includes cobalt.

In some embodiments, the conductive layer 111 includes a first portion 111a extending into the first active area 104a of the semiconductor substrate 101 from the first surface 101a, and a second portion 111b disposed over the doped member 105 and coupled to the first portion 111a. The first portion 111a is coupled to and extends from the second portion 111b. In some embodiments, the first portion 111a of the conductive layer 111 is substantially orthogonal to the second portion 111b of the conductive layer 111.

In some embodiments, the first portion 111a and the second portion 111b are integral. In some embodiments, the first portion 111a and the second portion 111b are formed simultaneously or separately. In some embodiments, the formation of the first portion 111a is performed prior to the formation of the second portion 111b. The conductive materials included in the first portion 111a and the second portion 111b may be same or different.

In some embodiments, the first portion 111a of the conductive layer 111 is disposed between the gate structure 103 and the doped member 105. In some embodiments, the first portion 111a of the conductive layer 111 is disposed between the first active area 104a and the doped member 105. In some embodiments, the first portion 111a of the conductive layer 111 extends into the first active area 104a of the semiconductor substrate 101 from the first surface 101a. In some embodiments, the first portion 111a of the conductive layer 111 is disposed within the first active area 104a. In some embodiments, the first portion 111a of the conductive layer 111 is disposed within the second recess 104b. In some embodiments, the first portion 111a of the conductive layer 111 is in contact with the doped member 105.

In some embodiments, the first portion 111a of the conductive layer 111 is disposed adjacent to the first insulating layer 106a. In some embodiments, the first portion 111a of the conductive layer 111 is coupled to the first insulating layer 106a. In some embodiments, the first portion 111a of the conductive layer 111 is disposed on the first side 104c of the second recess 104b. In some embodiments, the first portion 111a of the conductive layer 111 contacts the first insulating layer 106a and the first active area 104a. When a current (not shown) flows through the first memory device 100, the current may flow in a direction indicated by an arrow A. In some embodiments, the current may flow along the gate structure 103 from the second active area 104m to the first active area 104a. Because the first insulating layer 106a is disposed within the first active area 104a and blocks the current, the current flows to the first portion 111a of the conductive layer 111, and flows through the first portion 111a of the conductive layer 111 to the second portion 111b of the conductive layer 111. In addition, because the first insulating layer 106a is configured to limit a P-N junction area within the first active area 104a, the current must pass through the conductive layer 111, and P-N junction leakage can therefore be prevented. Overall performance of the first memory device 100 is thereby improved.

In some embodiments, in order to avoid junction leakage, a length L1 of the first portion 111a of the conductive layer 111 is substantially equal to or less than a length L2 of the first insulating layer 106a. In some embodiments, the length L1 is less than the length L2. In some embodiments, the length L2 is more than twice the length L1. In some embodiments, the length L2 is 2 times to 30 times the length L1.

In some embodiments, the second portion 111b of the conductive layer 111 covers the doped member 105. In some embodiments, the second portion 111b of the conductive layer 111 is in contact with the doped member 105. In some embodiments, the second portion 111b is disposed over the first insulating layer 106a and the first active area 104a. In some embodiments, the second portion 111b of the conductive layer 111 is disposed over the first portion 111a of the conductive layer 111. In some embodiments, the second portion 111b of the conductive layer 111 is in contact with the first insulating layer 106a. In some embodiments, the doped member 105 is disposed between the first insulating layer 106a and the second portion 111b of the conductive layer 111.

In some embodiments, the first memory device 100 includes a second insulating layer 106b disposed over the gate structure 103. In some embodiments, the first insulating layer 106a and the second insulating layer 106b are separated from each other. In some embodiments, the second insulating layer 106b is disposed over the gate structure 103, the second active area 104m and the isolation structure 102 adjacent to the second active area 104m. In some embodiments, the second insulating layer 106b is in contact with the gate structure 103. In some embodiments, the second insulating layer 106b includes oxide. In some embodiments, the second insulating layer 106b includes silicon oxide or the like. In some embodiments, the first insulating layer 106a and the second insulating layer 106b include same materials. In some embodiments, a thickness T1 of the first insulating layer 106a is less than or equal to a thickness T2 of the second insulating layer 106b. In some embodiments, the first insulating layer 106a and the second insulating layer 106b are formed simultaneously or separately.

In some embodiments, the first portion 111a of the conductive layer 111 is disposed between and coupled to the first insulating layer 106a and the second insulating layer 106b. In some embodiments, the second portion 111b of the conductive layer 111 is disposed between the first insulating layer 106a and the second insulating layer 106b. In some embodiments, the second portion 111b of the conductive layer 111 is substantially coplanar with a top surface 106c of the second insulating layer 106b. In some embodiments, a top surface 105a of the doped member 105 is substantially coplanar with the top surface 106c of the second insulating layer 106b. In some embodiments, the top surface 106c of the second insulating layer 106b is substantially lower than the second portion 111b of the conductive layer 111.

Figure 2:
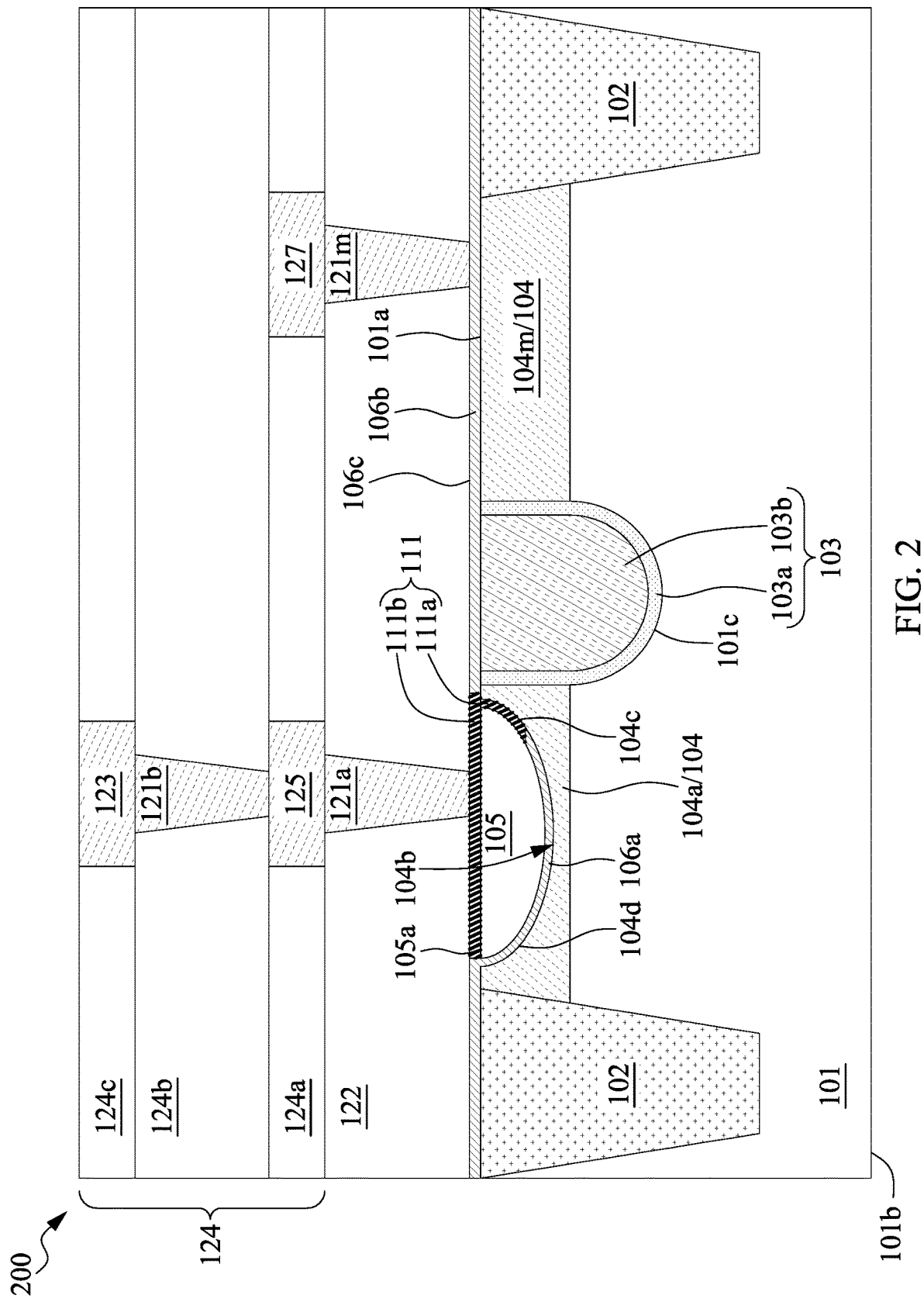
FIG. 2 is a cross-sectional side view of a memory device in accordance with other embodiments of the present disclosure.

FIG. 2 is a schematic cross-sectional side view of a second memory device 200 in accordance with some embodiments of the present disclosure. In some embodiments, the second memory device 200 illustrated in FIG. 2 is similar to the first memory device 100 illustrated in FIG. 1, except the second memory device 200 further includes a contact 121a disposed over the conductive layer 111, and a capacitor 123 electrically connected to the conductive layer 111 through the contact 121a. In some embodiments, a landing pad 125 is disposed over the contact 121a, and a contact 121b is disposed over the landing pad 125, the landing pad 125 and the contact 121b are disposed between the contact 121a and the capacitor 123. In some embodiments, the capacitor 123 is electrically connected to the first active region 104a in the semiconductor substrate 101 by the contacts 121a, 121b, the landing pad 125, and the conductive layer 111. In some embodiments, the capacitor 123 is disposed over the contacts 121a, 121b and the landing pad 125. In some embodiments, the second memory device 200 is a DRAM.

In some embodiments, the second memory device 200 further includes a contact 121m disposed over the second active region 104m, and a bit line 127 electrically connected to the second active region 104m in the semiconductor substrate 101 through the contact 121m. In some embodiments, the contact 121m penetrates through the second insulating layer 106b. In some embodiments, the contact 121m is surrounded by the second insulating layer 106b and electrically connected to the second active region 104m. In some embodiments, the bit line 127 is disposed adjacent to the landing pad 125.

In some embodiments, the contacts 121a, 121b, 121m include conductive material, such as polycrystalline silicon, tungsten (W), copper (Cu), or the like. In some embodiments, the capacitor 123, the landing pad 125 and the bit line 127 include conductive material, such as polycrystalline silicon, tungsten (W), copper (Cu), or the like. The contacts 121a, 121b, 121m, the capacitor 123, the landing pad 125 and the bit line 127 include a same material or different materials.

In some embodiments, the second memory device 200 including a first dielectric layer 122 surrounding the contacts 121a, 121m and covering the conductive layer 111, the first insulating layer 106a, the second insulating layer 106b, the doped member 105, the active area 104 and the gate structure 103. In some embodiments, the contacts 121a, 121m penetrates through the first dielectric layer 122. In some embodiments, the first dielectric layer 122 includes silicon oxide, silicon nitride, silicon oxynitride, phosphosilicate glass (PSG), borophosphosilicate glass (BPSG), low-k dielectric material, and/or another applicable dielectric material.

In some embodiments, the second memory device 200 including a second dielectric layer 124 over the first dielectric layer 122 and surrounding the capacitor 123. In some embodiments, the second dielectric layer 124 includes a plurality of sub-layers 124a, 124b, 124c. In some embodiments, the sub-layer 124a is disposed over the first dielectric layer 122, and the landing pad 125 is surrounded by the sub-layer 124a. In some embodiments, the sub-layer 124b is disposed over the sub-layer 124a, and the contact 121b is surrounded by the sublayer 124b. In some embodiments, the sub-layer 124c is disposed over the sub-layer 124b, and the capacitors 123 is surrounded by the sublayer 124c. In some embodiments, the bit line 127 is surrounded by the second dielectric layer 124. In some embodiments, the bit line 127 is surrounded by the sub-layer 124a.

In some embodiments, a plurality of capacitors 123 are disposed within the second dielectric layer 124. In some embodiments, the capacitors 123 are electrically connected to corresponding active regions 104 in the semiconductor substrate 101 by a plurality of landing pads 125 and a plurality of contacts 121a, 121b. In some embodiments, the capacitors 123 are disposed within second dielectric layer 124. In some embodiments, the second dielectric layer 124 includes silicon oxide, silicon nitride, silicon oxynitride, phosphosilicate glass (PSG), borophosphosilicate glass (BPSG), low-k dielectric material, and/or another applicable dielectric material. The first dielectric layer 122 and the second dielectric layer 124 include a same material or different materials. In some embodiments, the second dielectric layer 124 is an inter-layer dielectric (ILD).

Figure 3:
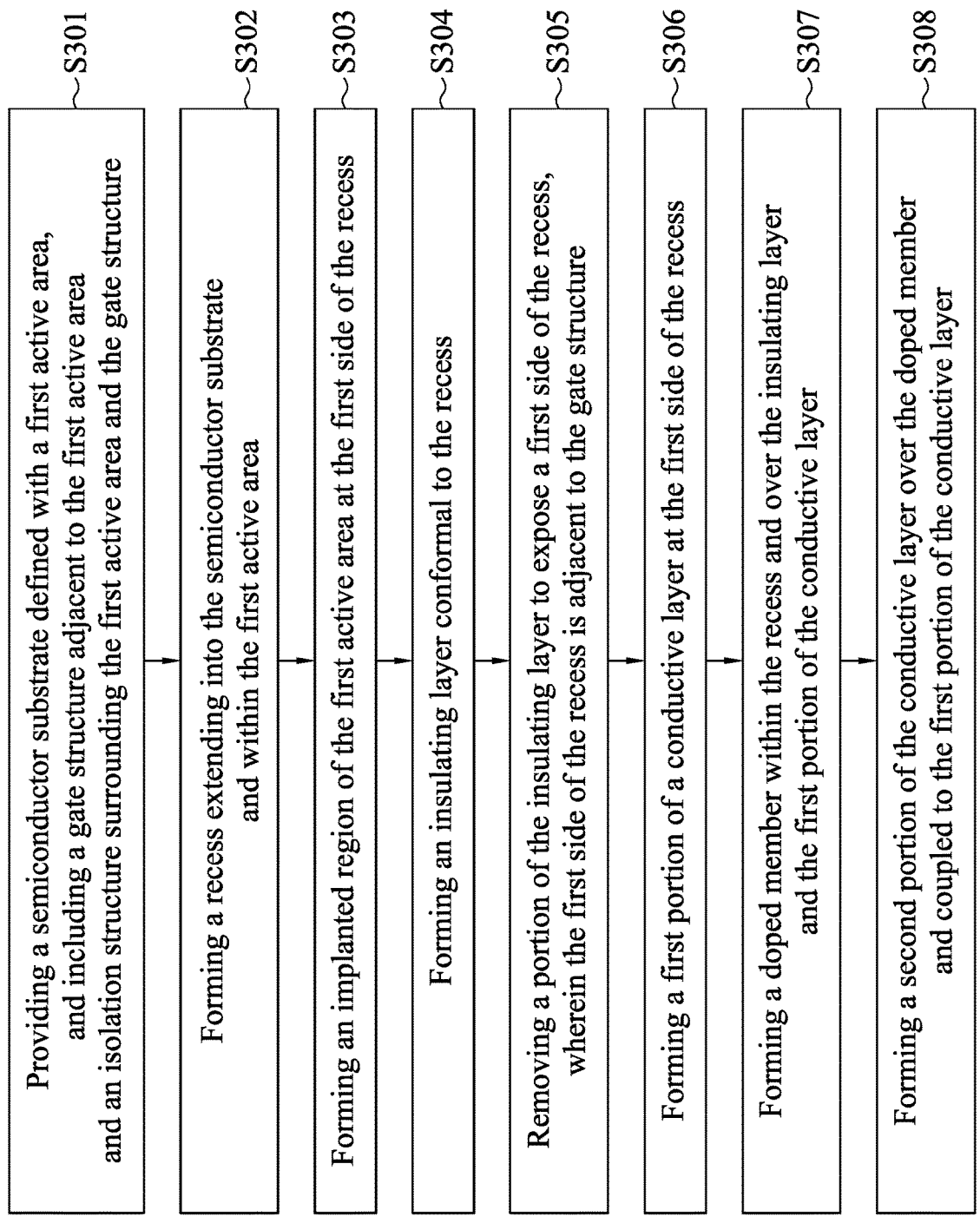
FIG. 3 is a flow diagram illustrating a method of manufacturing a memory device in accordance with some embodiments of the present disclosure.

FIG. 3 is a flow diagram illustrating a method S300 of manufacturing the first memory device 100 or the second memory device 200 in accordance with some embodiments of the present disclosure, and FIGS. 4 to 20 illustrate cross-sectional views of intermediate stages in formation of the first memory device 100 or the second memory device 200 in accordance with some embodiments of the present disclosure.

The stages shown in FIGS. 4 to 20 are also illustrated schematically in the flow diagram in FIG. 3. In following discussion, the fabrication stages shown in FIGS. 4 to 20 are discussed in reference to process steps shown in FIG. 3. The method S300 includes a number of operations, and description and illustration are not deemed as a limitation to a sequence of the operations. The method S300 includes a number of steps (S301, S302, S303, S304, S305, S306, S307 and S308).

Figure 4:
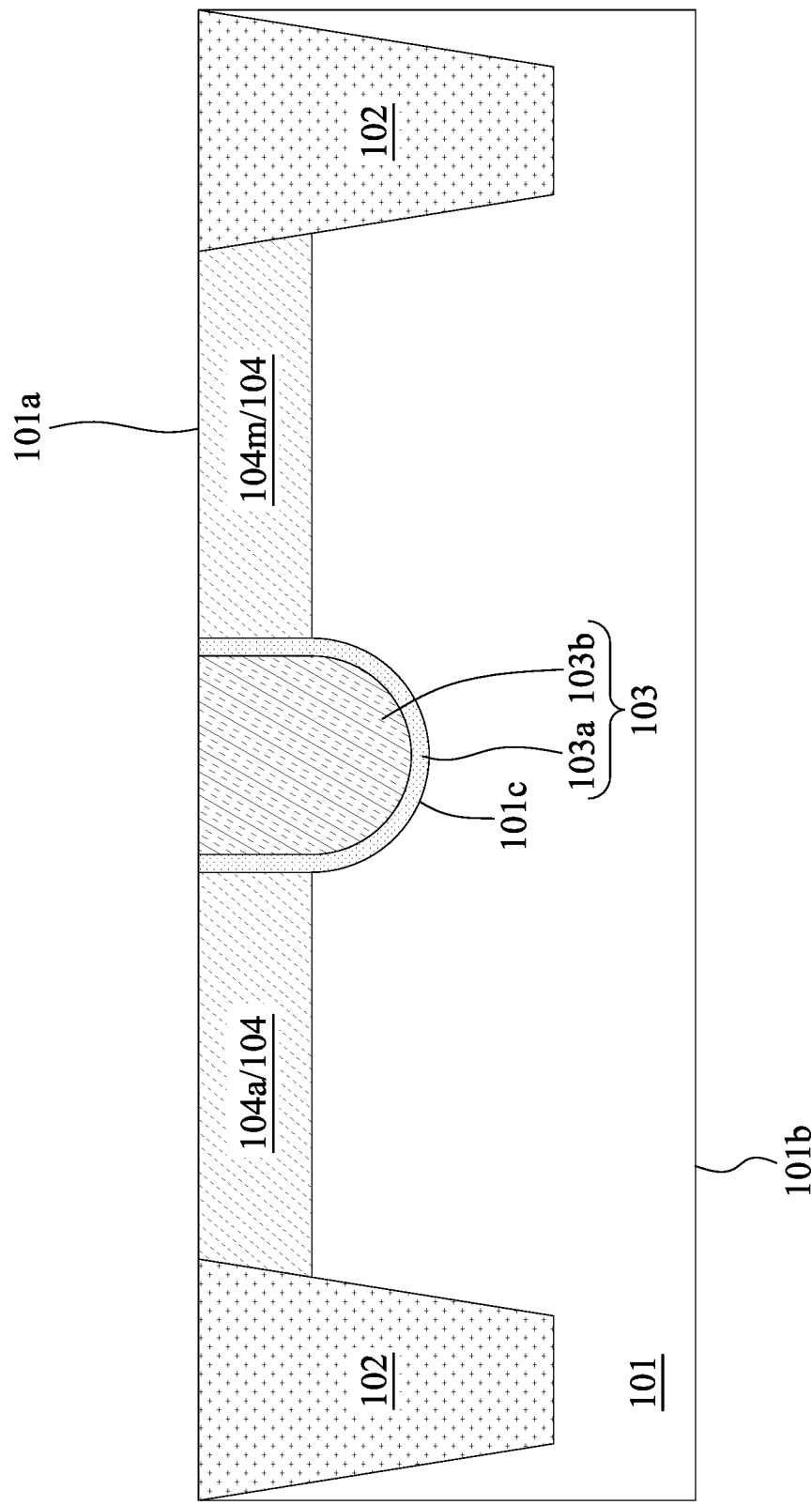
FIGS. 4 to 20 illustrate cross-sectional views of intermediate stages in the formation of a memory device in accordance with some embodiments of the present disclosure.

Referring to FIG. 4, a semiconductor substrate 101 is provided according to step S301 in FIG. 3. The semiconductor substrate 101 is defined with a first active area 104a, and includes a gate structure 103 adjacent to the first active area 104a and an isolation structure 102 surrounding the first active area 104a and the gate structure 103. In some embodiments, the gate structure 103 is disposed adjacent to the first active area 104a and extends from a first surface 101a toward a second surface 101b of the semiconductor substrate 101. In some embodiments, the isolation structure 102 extends from the first surface 101a toward the second surface 101b of the semiconductor substrate 101. In some embodiments, the gate structure 103 is disposed between the first active area 104a and a second active area 104m. In some embodiments, the first active area 104a includes N-type dopants. In some embodiments, the semiconductor substrate 101 is a p-type substrate.

Figure 5:
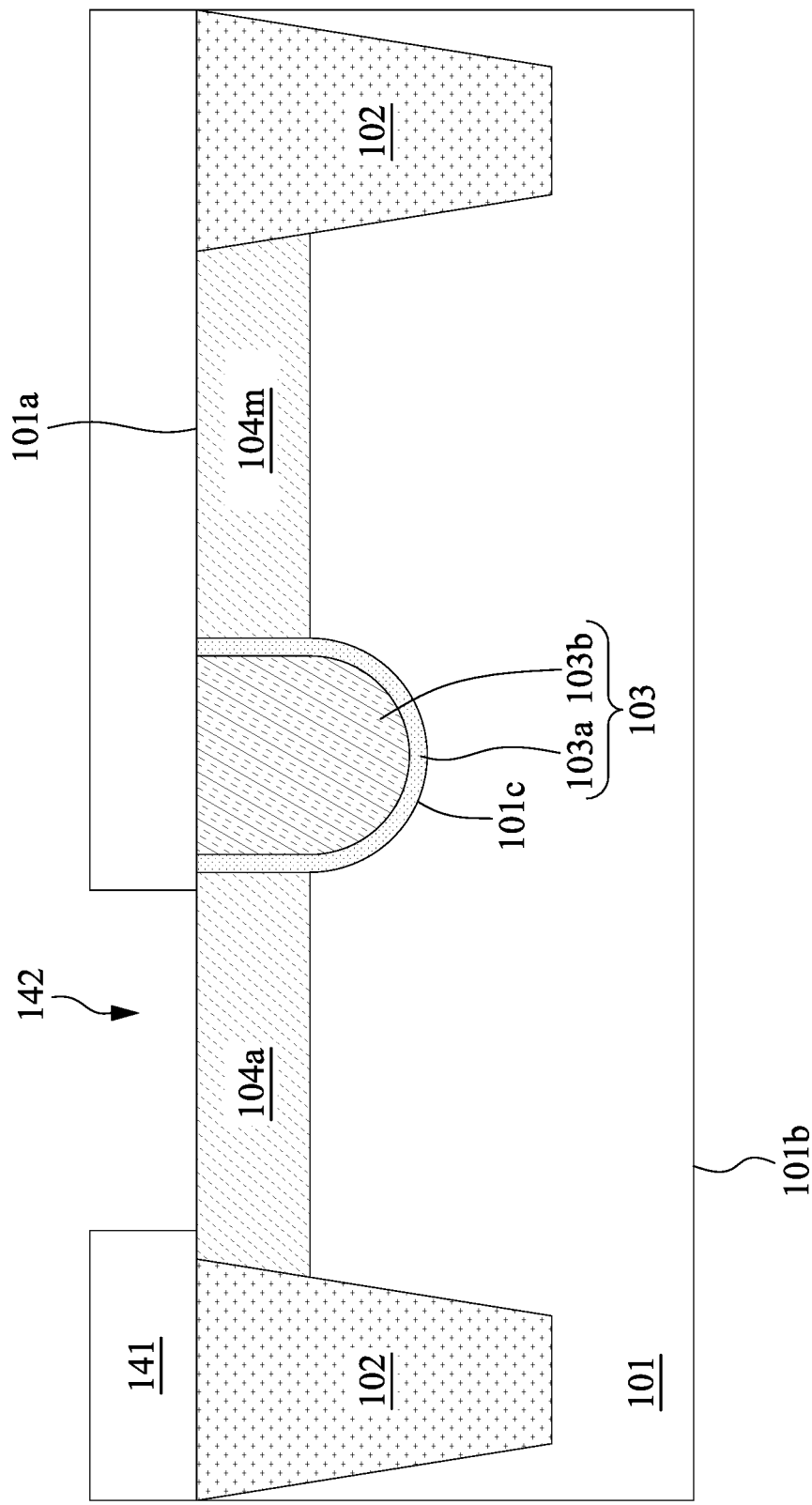
Figure 6:
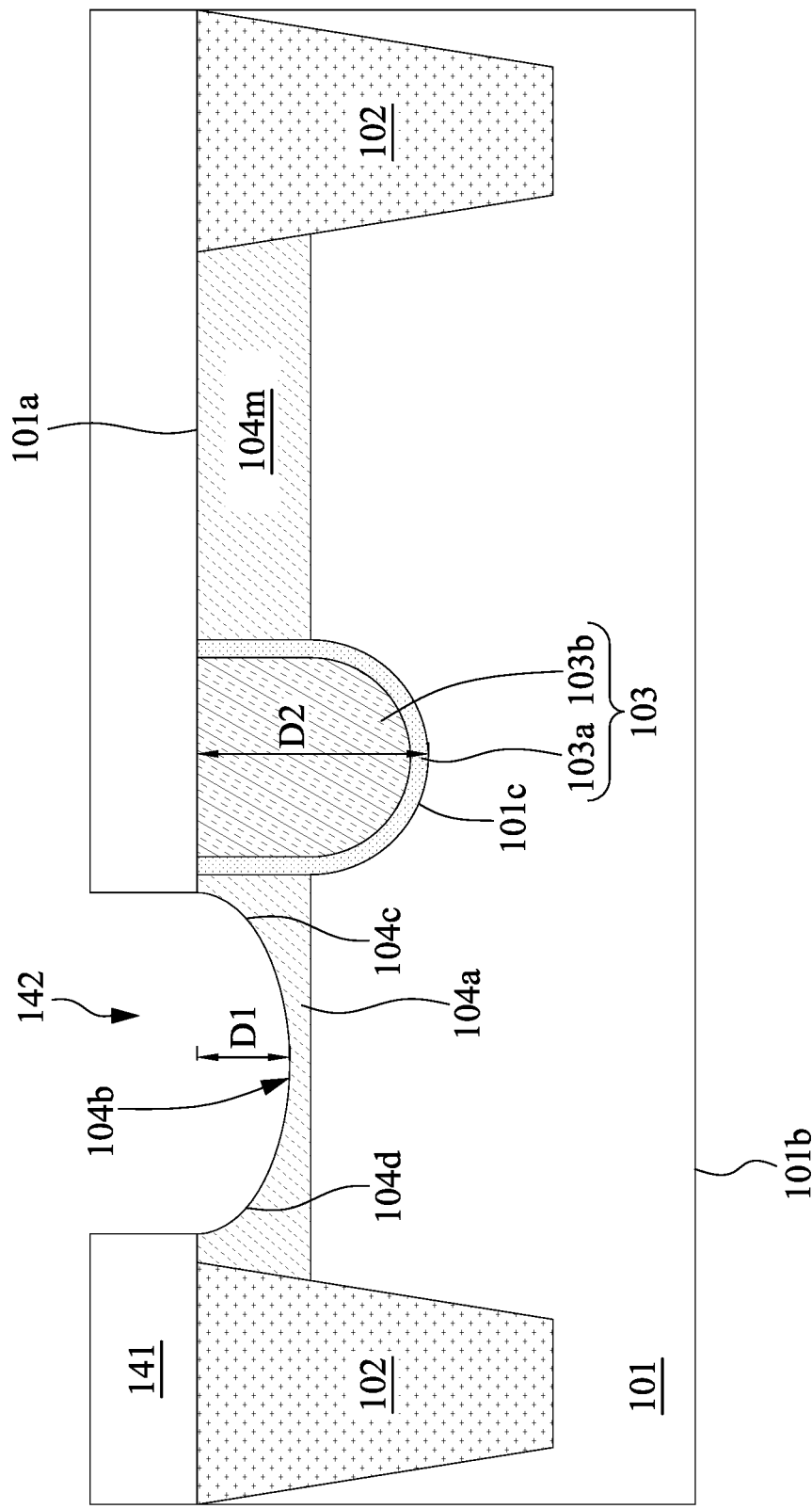
Figure 7:
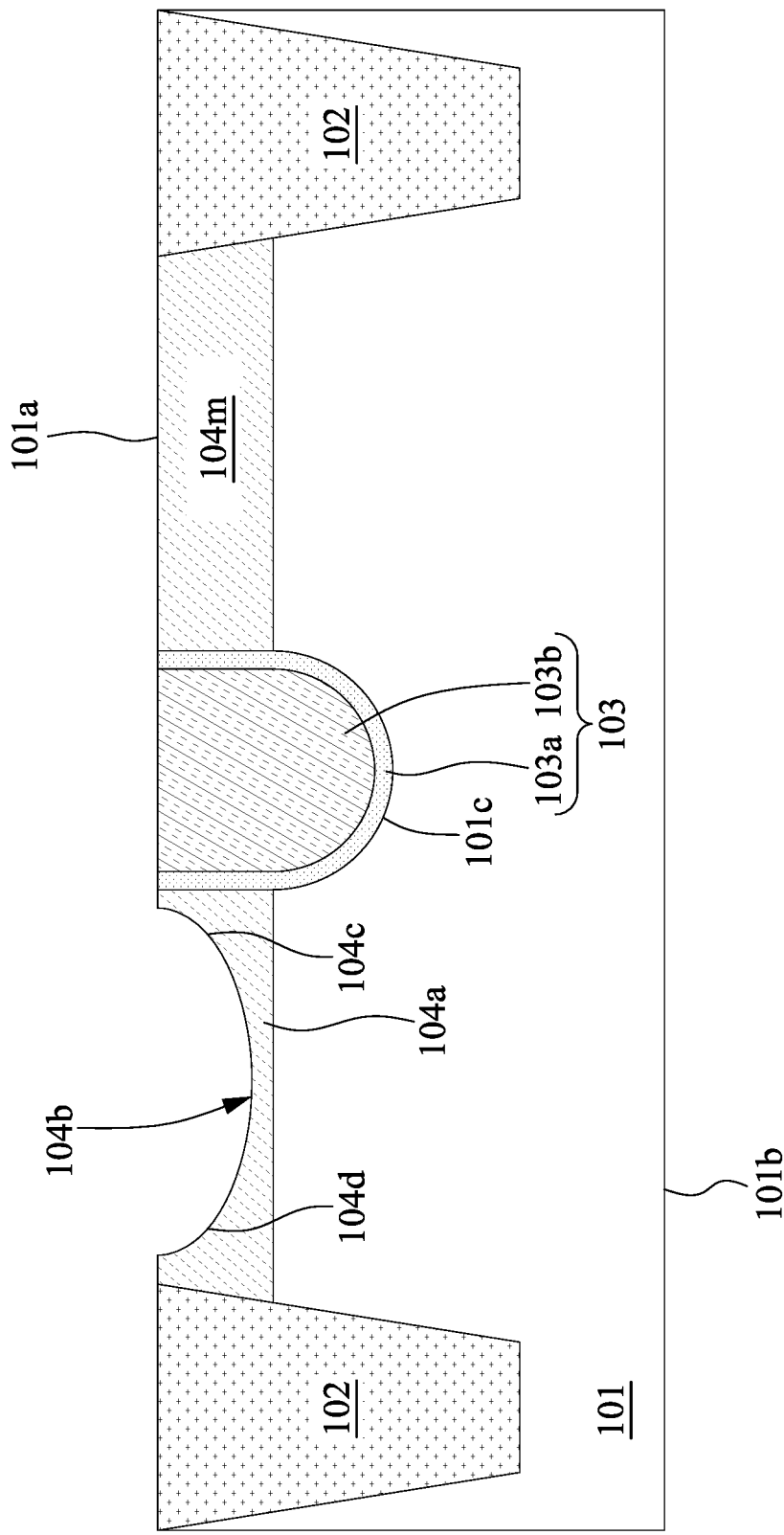

Referring to FIGS. 5 to 7, a recess 104b is formed extending into the semiconductor substrate 111 and within the first active area 104a according to step S302 in FIG. 3. In some embodiments, referring to FIG. 5, a pattern mask 141 is disposed over the first surface 101a of the semiconductor substrate 101. In some embodiments, the pattern mask 141 includes an opening 142 provided over the first active area 104a. The opening 142 exposes the first active area 104a proximal to the gate structure 103. The pattern mask 141 is formed by steps including (1) conformally coating a photosensitive material on the first surface 101a of the semiconductor substrate 101, (2) exposing portions of the photosensitive material to radiation (not shown), (3) performing a post-exposure baking process, and (4) developing the photosensitive material, thereby forming the opening 142 to expose the first active area 104a proximal to the gate structure 103.

Referring to FIG. 6, the recess 104b extending into the semiconductor substrate 101 is formed. In some embodiments, the recess 104b extends within the first active area 104a. In some embodiments, the formation of the recess 104b includes removing some portions of the semiconductor substrate 101. In some embodiments, the recess 104b extends from the first surface 101a toward the second surface 101b of the semiconductor substrate 101. In some embodiments, a depth D1 of the recess 104b is less than a depth D2 of the gate structure 103. In some embodiments, the recess 104b has a first side 104c adjacent to the gate structure 103 and a second side 104d opposite to the first side 104c and adjacent to the isolation structure 102. In some embodiments, the recess 104b is formed by etching or any other suitable process. In some embodiments, the recess 104b is formed by dry etching. Referring to FIG. 7, in some embodiments, the pattern mask 141 is removed after the recess 104b is formed.

Figure 8:
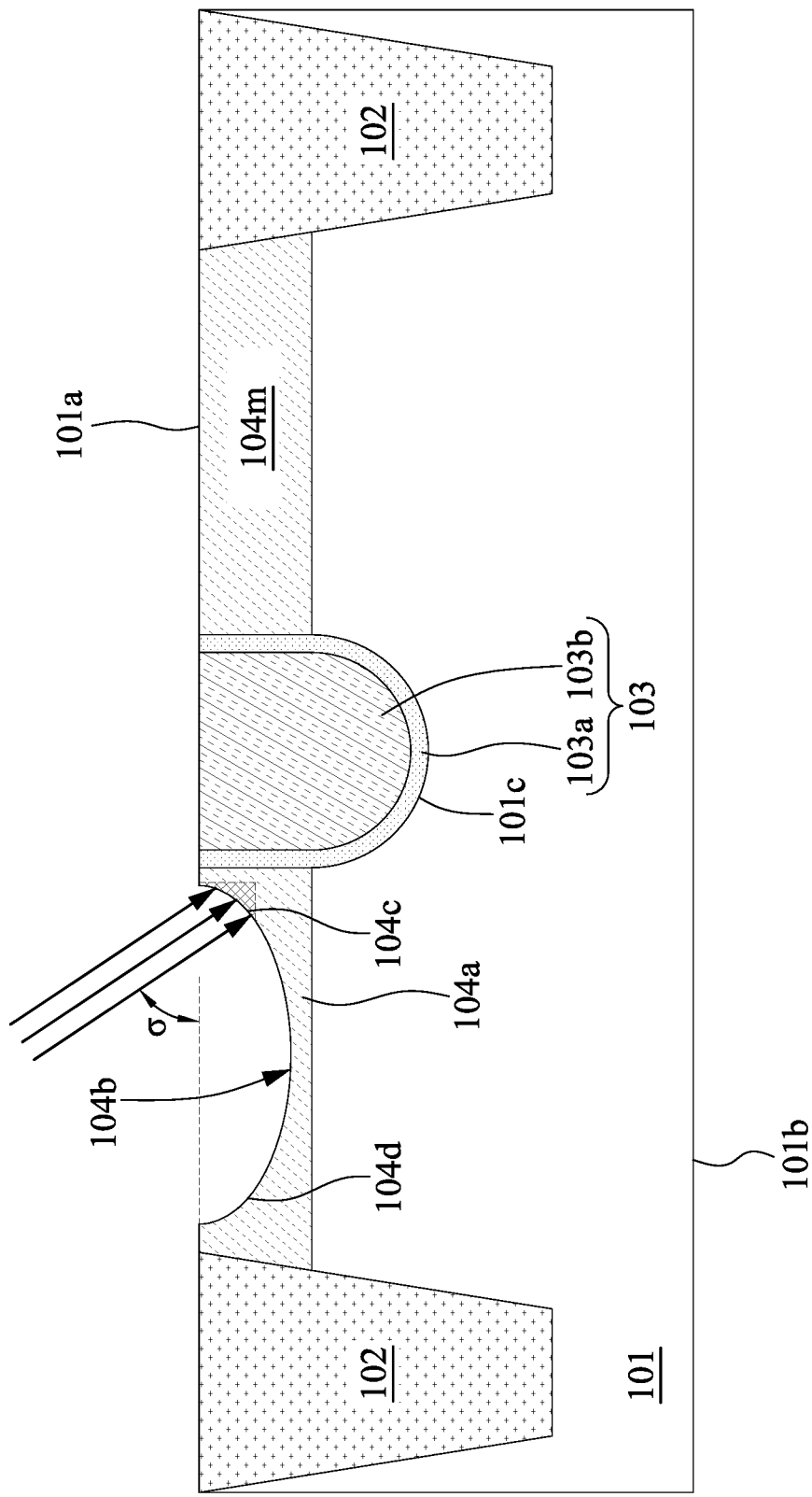

Referring to FIG. 8, an implanted region 104e of the first active area 104a is formed on the first side 104c of the recess 104b according to step S303 in FIG. 3. In some embodiments, the implanted region 104e is formed by implanting implants in the recess 104b and toward the gate structure 103. In some embodiments, the implanted region 104e is formed by implanting implants at an angle σ into the first active area 104a of the semiconductor substrate 101. In some embodiments, the angle σ relative to the first surface 101a of the semiconductor substrate 101 ranges between 7 degrees and 30 degrees. In some embodiments, the implanted region 104e is formed by nitrogen ion implantation. In some embodiments, step S303 is omitted.

Figure 9:
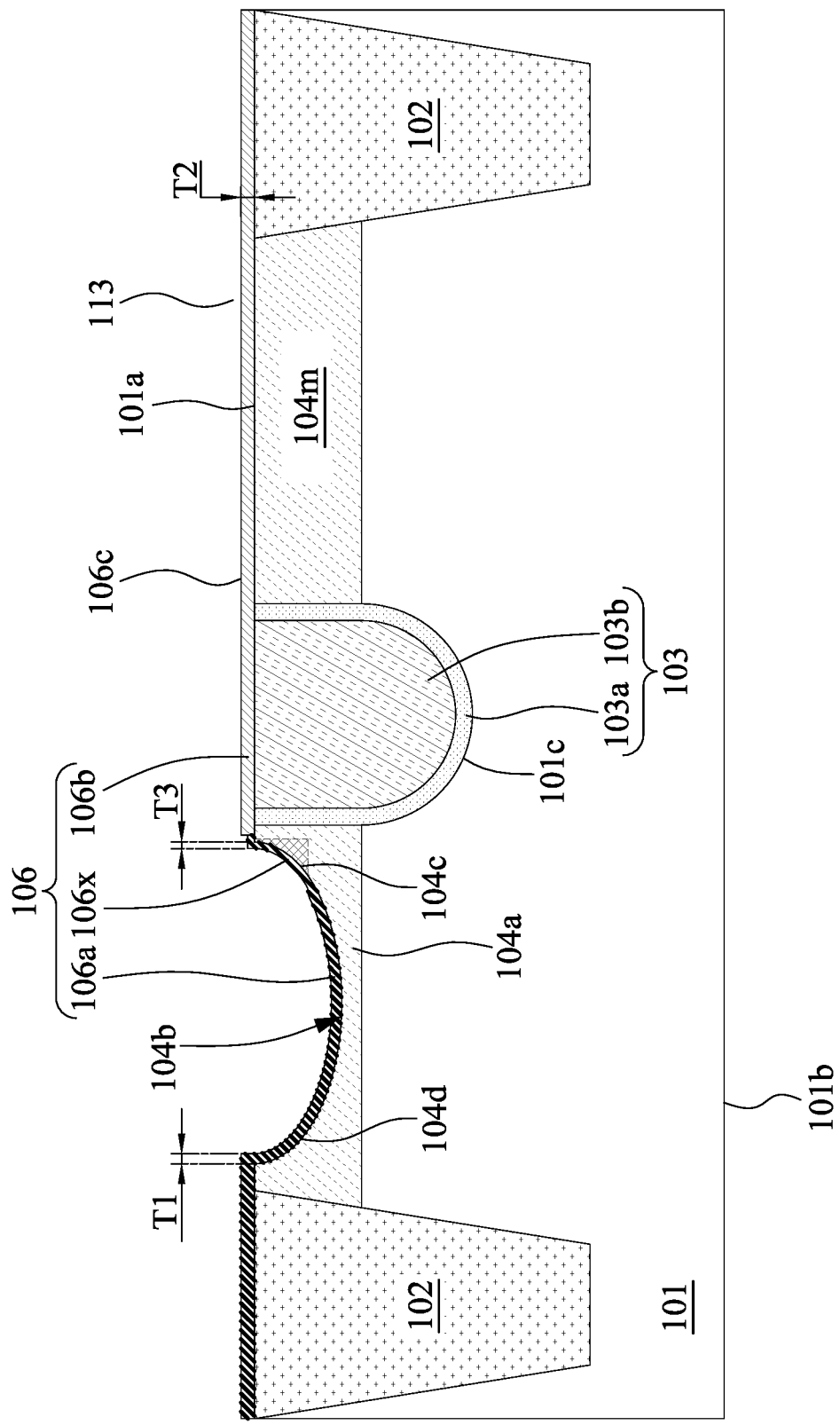

Referring to FIG. 9, an insulating layer 106 is formed conformal to the recess 104b according to step S304 in FIG. 3. In some embodiments, the insulating layer 106 is formed over the isolation structure 102, the recess 104b, the gate structure 103 and the second active area 104m. In some embodiments, the insulating layer 106 is formed over the first surface 101a of the semiconductor substrate 101. In some embodiments, the insulating layer 106 is formed by deposition, oxidation, a spin-coating process, or any other suitable process. In some embodiments, the insulating layer 106 is formed by a chemical vapor deposition (CVD) process, a physical vapor deposition (PVD) process, an atomic layer deposition (ALD) process, or any other suitable process. In some embodiments, the insulating layer 106 includes oxide such as silicon oxide.

In some embodiments, the insulating layer 106 is not easily formed on the first side 104c of the recess 104b. In some embodiments, the insulating layer 106 is not easily formed on the implanted region 104e. In some embodiments, a thickness T3 of a portion 106x of the insulating layer 106 over the implanted region 104e is less than a thickness T1 of a portion 106a of the insulating layer 106 over the second side 104d of the recess 104b.

Figure 10:
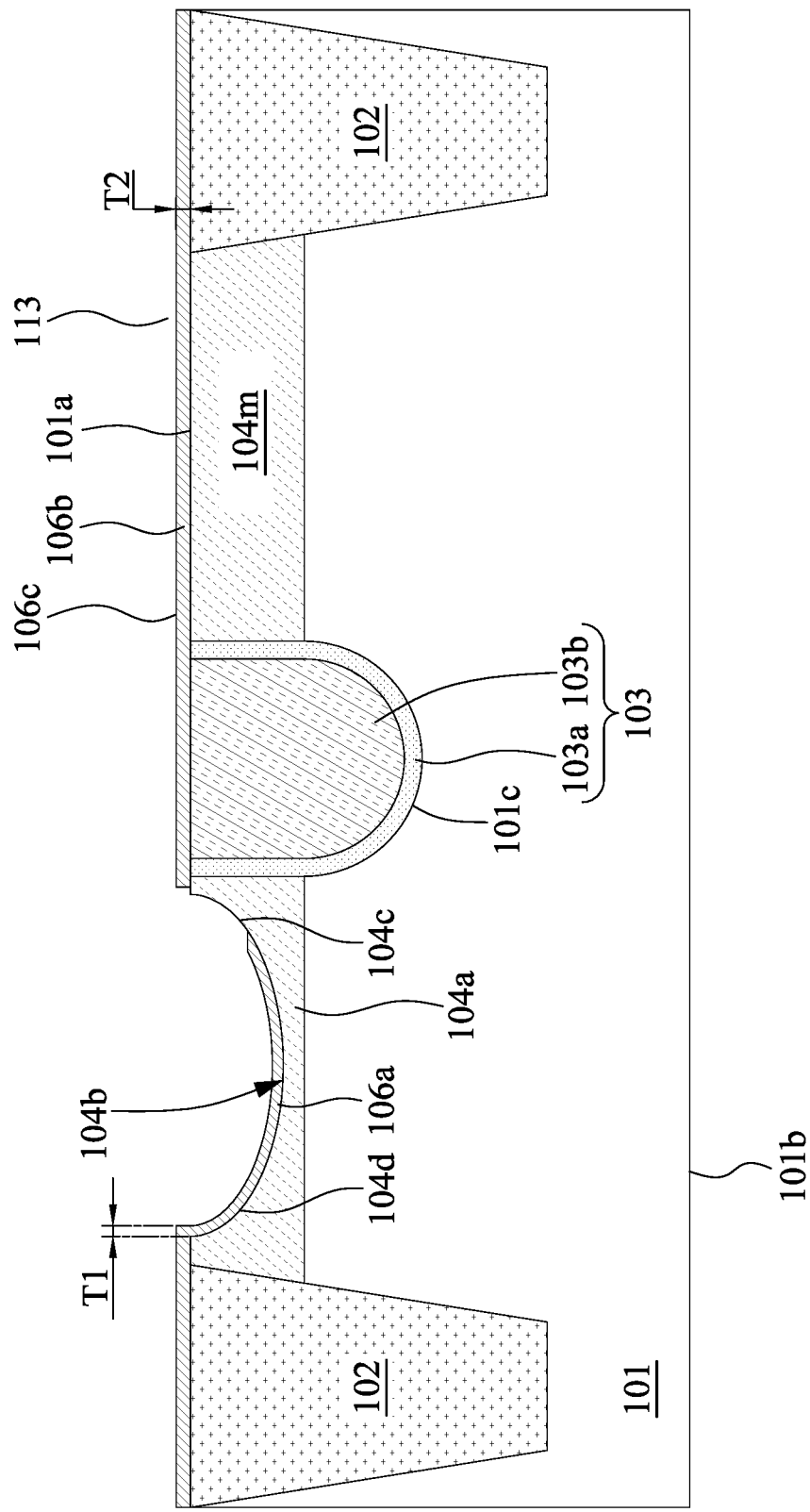

Referring to FIG. 10, according to step S305 in FIG. 3, the portion 106x of the insulating layer 106 is removed to expose the first side 104c of the recess 104b, wherein the first side 104c of the recess 104b is adjacent to the gate structure 103. In some embodiments, the portion 106x of the insulating layer 106 is disposed over the implanted region 104e. In some embodiments, the portion 106x of the insulating layer 106 is removed by etching or any other suitable process. In some embodiments, the portion 106x of the insulating layer 106 is washed away by a dilute hydrofluoric acid solution (DHF). In some embodiments, the implants of the implanted region 104e are removed after the first side 104c of the recess 104b is exposed.

In some embodiments, after the removal of the portion 106x of the insulating layer 106, the insulating layer 106 is separated into a first segment 106a disposed within the recess 104b and a second segment 106b disposed over the gate structure 103. In some embodiments, the thickness T1 of the first segment 106a of the insulating layer 106 is less than a thickness T2 of the second segment 106b of the insulating layer 106 after the removal of the portion 106x of the insulating layer 106. In some embodiments, the first segment 106a of the insulating layer 106 forms a first insulating layer 106a, and the second segment 106b of the insulating layer 106 forms a second insulating layer 106b.

Figure 11:
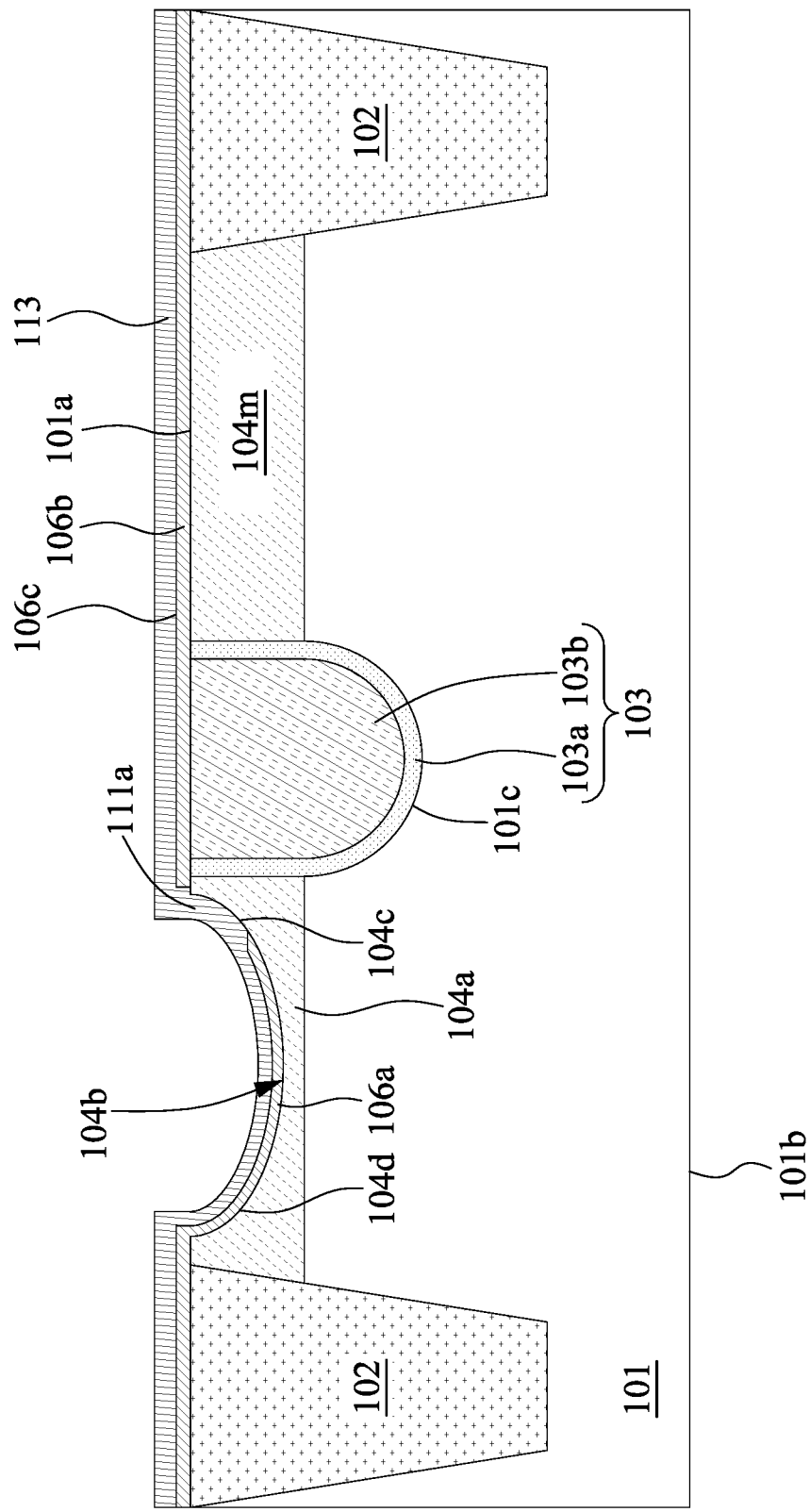
Figure 12:
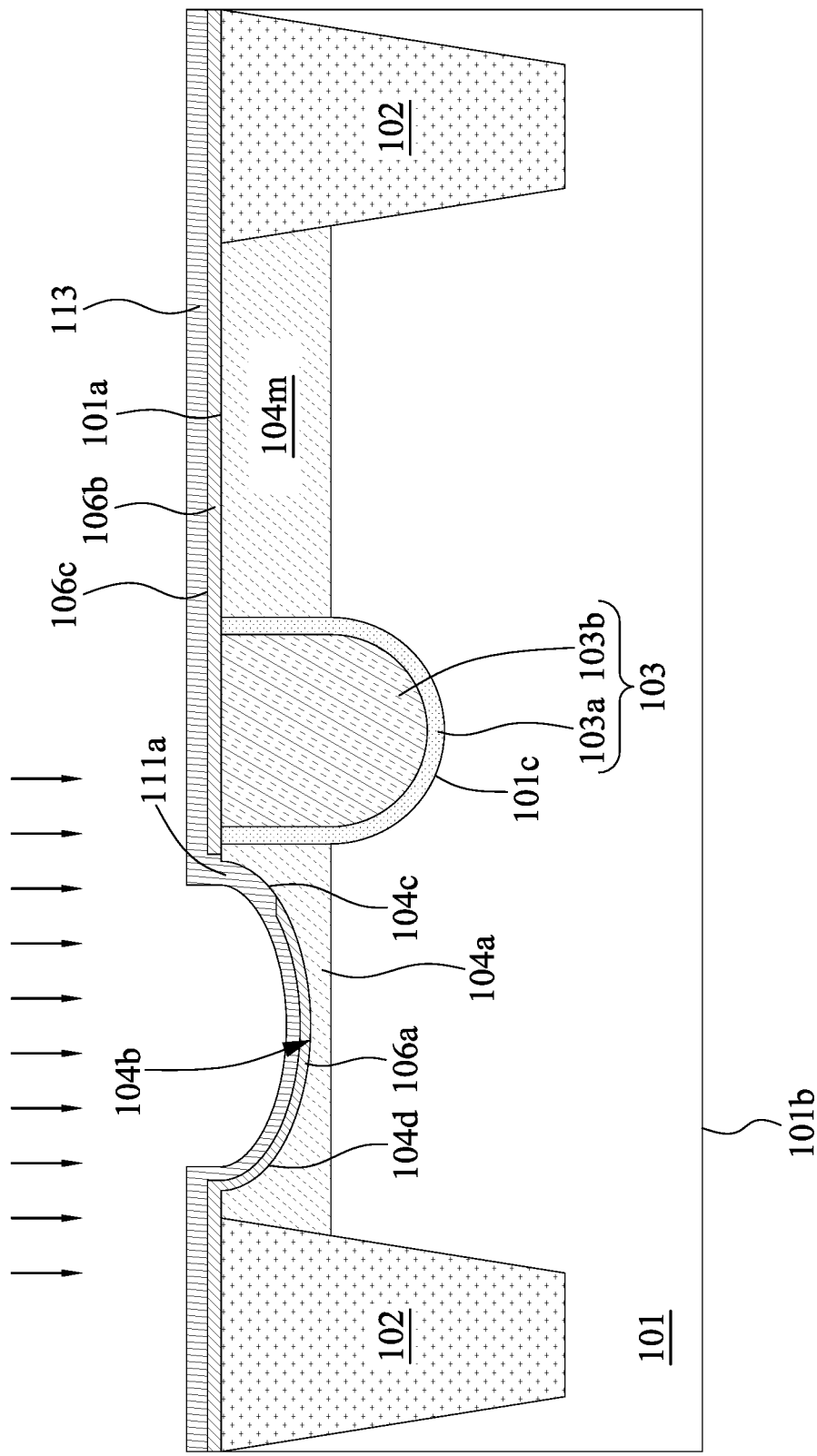
Figure 13:
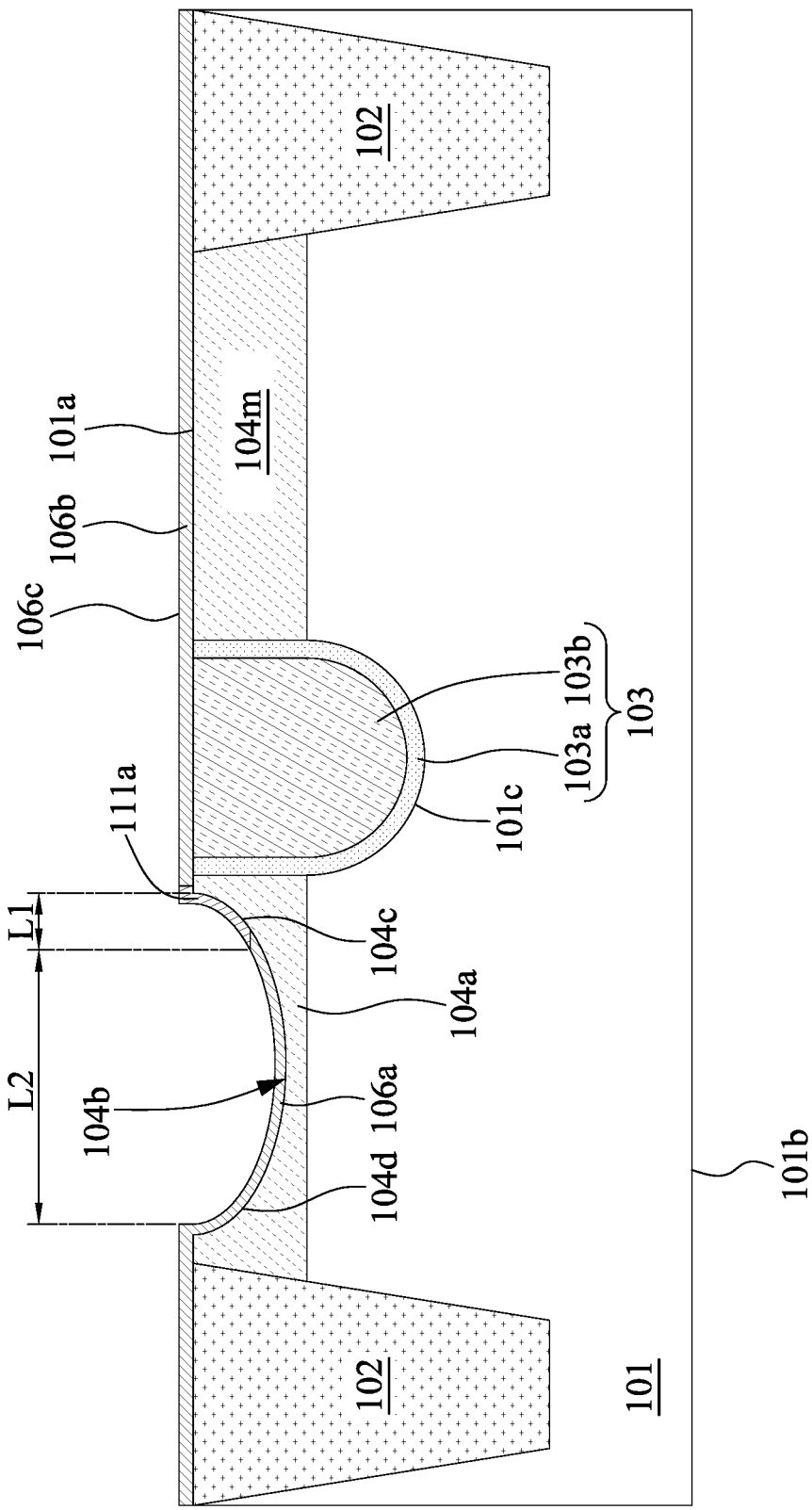

Referring to FIGS. 11 to 13, a first portion 111a of a conductive layer 111 on the first side 104c of the recess 104b is formed according to step S306 in FIG. 3. In some embodiments, referring to FIG. 11, a first conductive material 113 is disposed over the first side 104c of the recess 104b, the first insulating layer 106a and the second insulating layer 106b. In some embodiments, the first conductive material 113 is conformal to the first side 104c of the recess 104b. In some embodiments, the first conductive material 113 includes the first portion 111a of the conductive layer 111. In some embodiments, the first conductive material 113 is formed by a chemical vapor deposition (CVD) process, a physical vapor deposition (PVD) process, an atomic layer deposition (ALD) process or any other suitable process. In some embodiments, the first conductive material 113 includes cobalt.

In some embodiments, referring to FIG. 12, the first portion 111a of the conductive layer 111 is annealed. In some embodiments, the first conductive material 113 is annealed. In some embodiments, the first portion 111a of the conductive layer 111 is annealed at a temperature between 650° C. and 800° C.

In some embodiments, referring to FIG. 13, the first conductive material 113 disposed on the first insulating layer 106a and the second insulating layer 106b is removed, and the first portion 111a of the conductive layer 111 is formed on the first side 104c of the recess 104b. In some embodiments, the formation of the first portion 111a of the conductive layer 111 is performed after the formation of the insulating layer 106 and the removal of the portion 106x of the insulating layer 106.

In some embodiments, the first conductive material 113 disposed on the first insulating layer 106a and the second insulating layer 106b is removed by etching or any other suitable process. In some embodiments, the first conductive material 113 disposed on the first insulating layer 106a and the second insulating layer 106b is washed away by a dilute hydrofluoric acid solution (DHF). In some embodiments, a length L1 of the first portion 111a of the conductive layer 111 is substantially equal to or less than a length L2 of the first insulating layer 106a. In some embodiments, the length L1 is less than the length L2.

Figure 14:
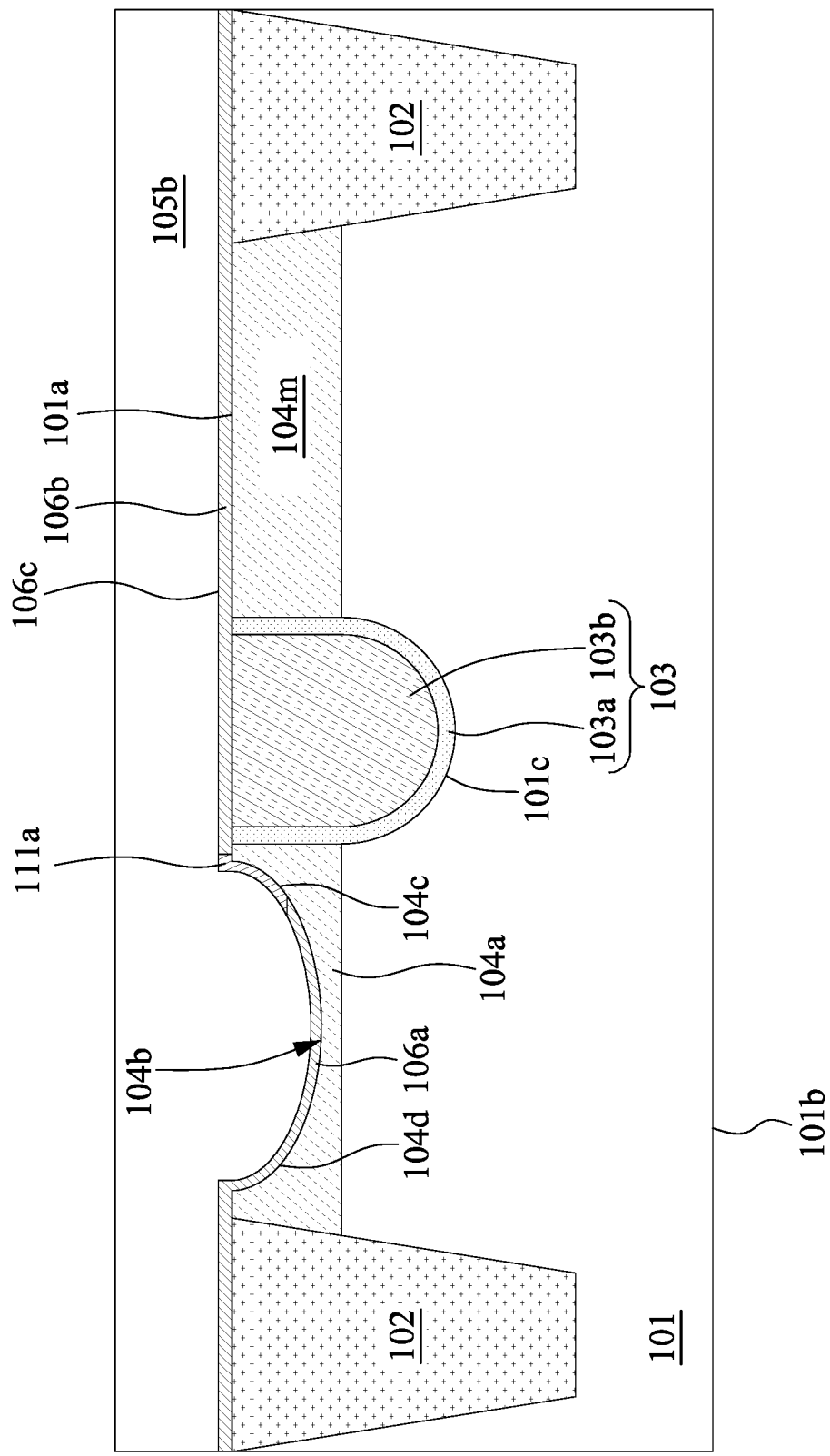
Figure 15:
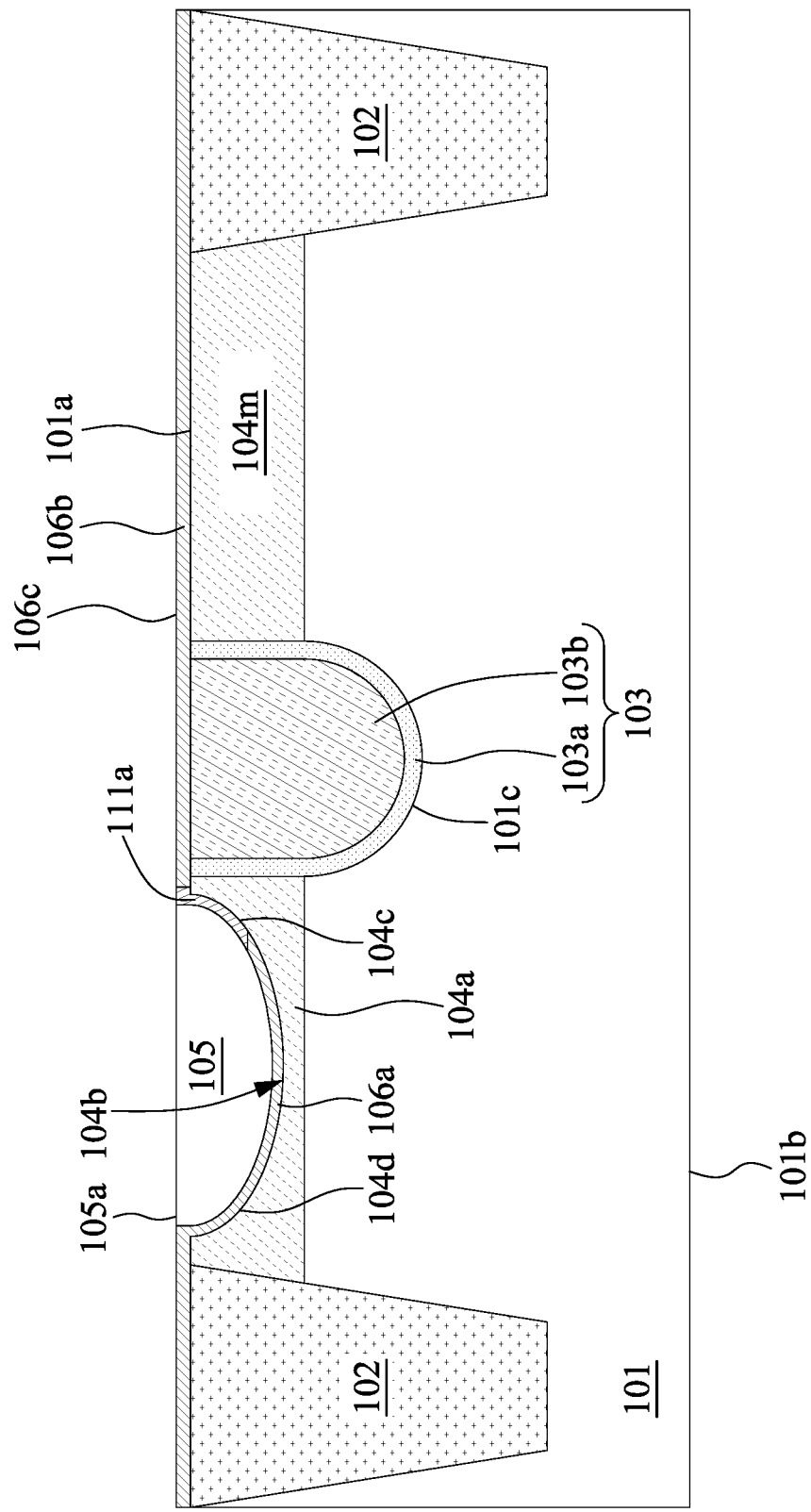

Referring to FIGS. 14 and 15, a doped member 105 is formed within the recess 104b and over the insulating layer 106 and the first portion 111a of the conductive layer 111 according to step S307 in FIG. 3. In some embodiments, referring to FIG. 14, a doped material 105b is disposed within the recess 104b and disposed over the first portion 111a of the conductive layer 111, the first insulating layer 106a and the second insulating layer 106b. In some embodiments, the doped material 105b includes polycrystalline silicon. In some embodiments, the doped material 105b is formed by a chemical vapor deposition (CVD) process, a physical vapor deposition (PVD) process, an atomic layer deposition (ALD) process, a spin-coating process, or another applicable process.

In some embodiments, referring to FIG. 15, after the doped material 105b is formed, a planarization process is performed, and the doped member 105 is formed within the recess 104b. In some embodiments, the planarization process includes a grinding process, a chemical mechanical polishing (CMP) process, an etching process, another applicable process, or a combination thereof. In some embodiments, a top surface 105a of the doped member 105 is substantially coplanar with a top surface 106c of the second insulating layer 106b.

Figure 16:
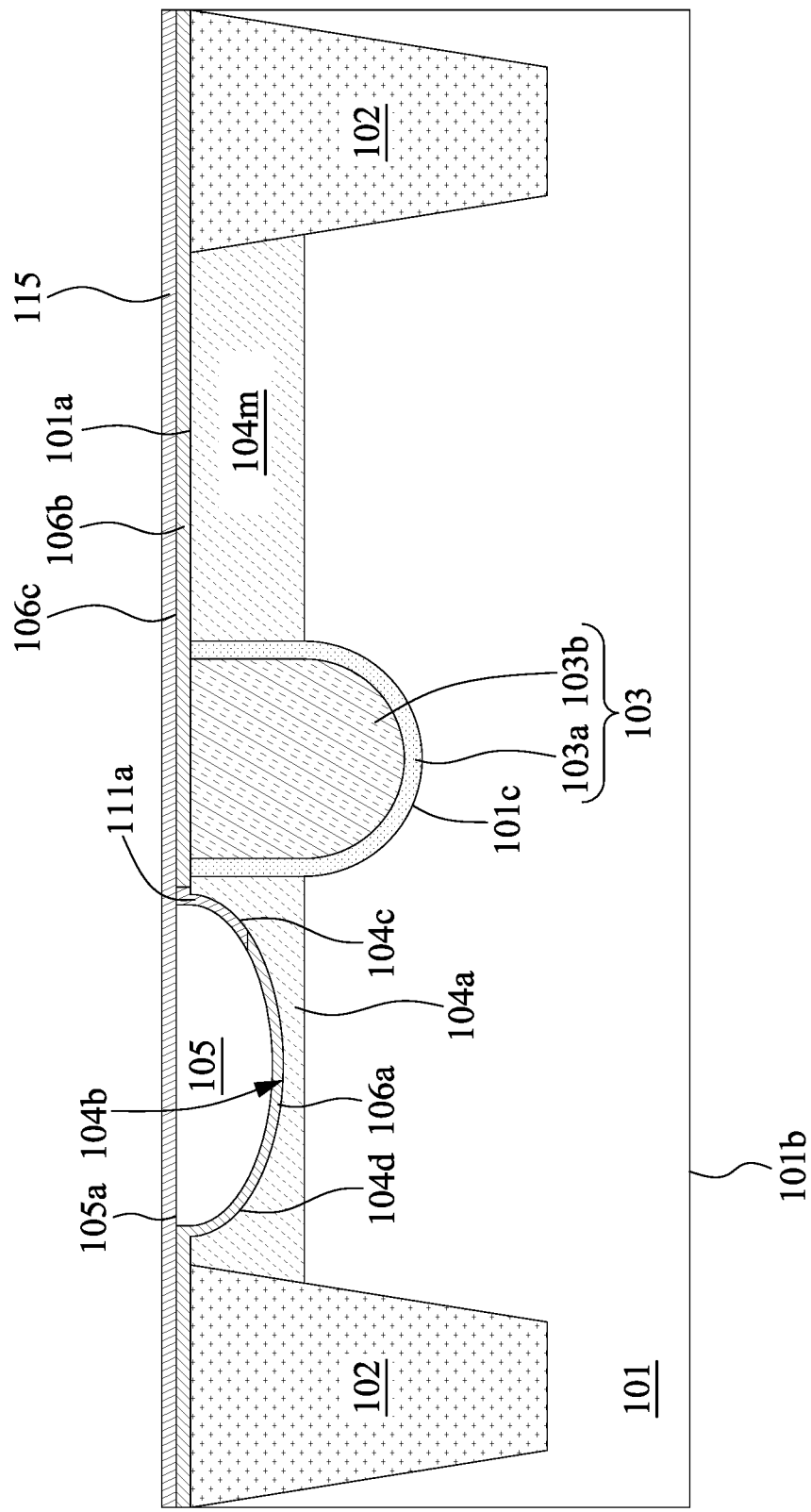
Figure 17:
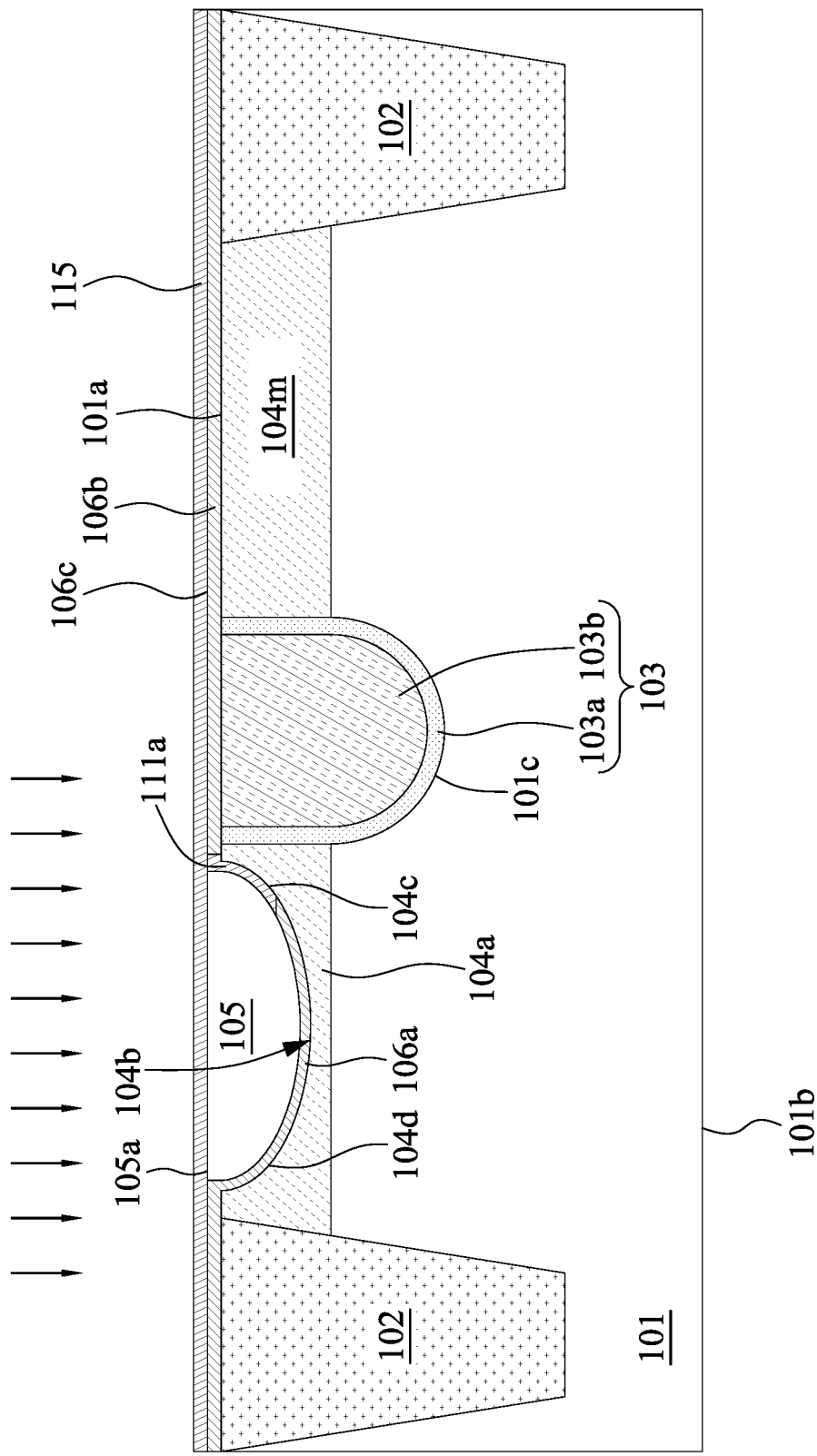
Figure 18:
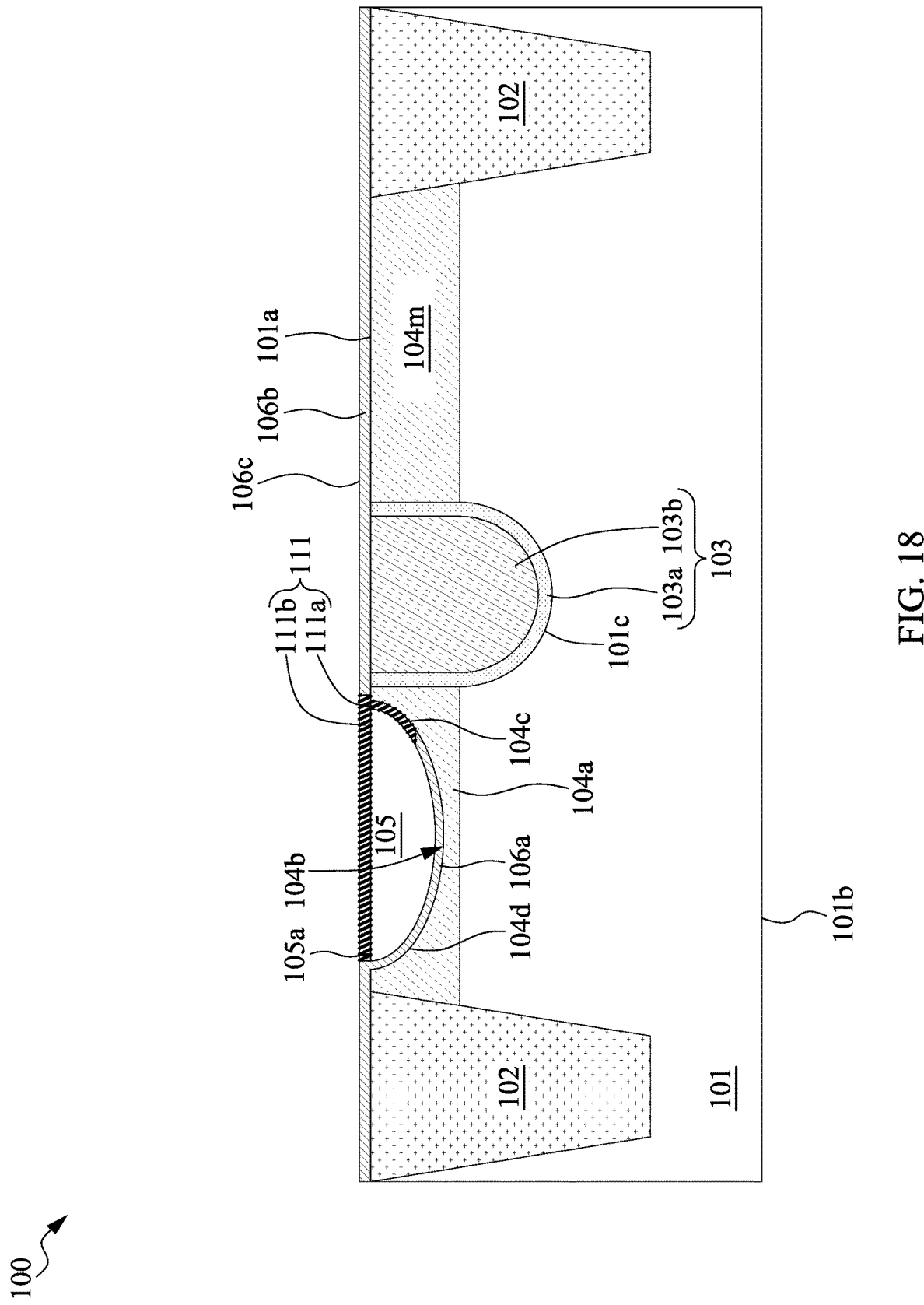

Referring to FIGS. 16 to 18, a second portion 111b of the conductive layer 111 is formed over the doped member 105 and coupled to the first portion 111a of the conductive layer 111 according to step S308 in FIG. 3.

In some embodiments, referring to FIG. 16, a second conductive material 115 is disposed over the doped member 105, the first insulating layer 106a and the second insulating layer 106b. In some embodiments, the second conductive material 115 is coupled to the first portion 111a of the conductive layer 111. In some embodiments, the second conductive material 115 includes the second portion 111b of the conductive layer 111 disposed over the doped member 105. In some embodiments, the second conductive material 115 is formed by a chemical vapor deposition (CVD) process, a physical vapor deposition (PVD) process, an atomic layer deposition (ALD) process or any other suitable process. In some embodiments, the second conductive material 115 includes cobalt.

In some embodiments, referring to FIG. 17, the second portion 111b of the conductive layer 111 is annealed. In some embodiments, the second conductive material 115 is annealed. In some embodiments, the second portion 111b of the conductive layer 111 is annealed at a temperature between 650° C. and 800° C. In some embodiments, the second conductive material 115 reacts with the doped member 105. In some embodiments, the second conductive material 115 includes $CoSiO_2$.

In some embodiments, referring to FIG. 18, the second conductive material 115 disposed on the second insulating layer 106b and the isolation structure 102 is removed, and the second portion 111b of the conductive layer 111 is formed on the doped member 105 and coupled to the first portion 111a of the conductive layer 111. In some embodiments, the formation of the second portion 111b of the conductive layer 111 is performed after the formation of the first portion 111a of the conductive layer 111 and the formation of the doped member 105. In some embodiments, the second portion 111b of the conductive layer 111 is substantially coplanar with a top surface 106c of the second insulating layer 106b. In some embodiments, the first memory device 100 is formed.

In some embodiments, the second conductive material 115 disposed on the second insulating layer 106b and the isolation structure 102 is removed by etching or any other suitable process. In some embodiments, the second conductive material 115 disposed on the second insulating layer 106b and the isolation structure 102 is washed away by a dilute hydrofluoric acid solution (DHF).

Figure 19:
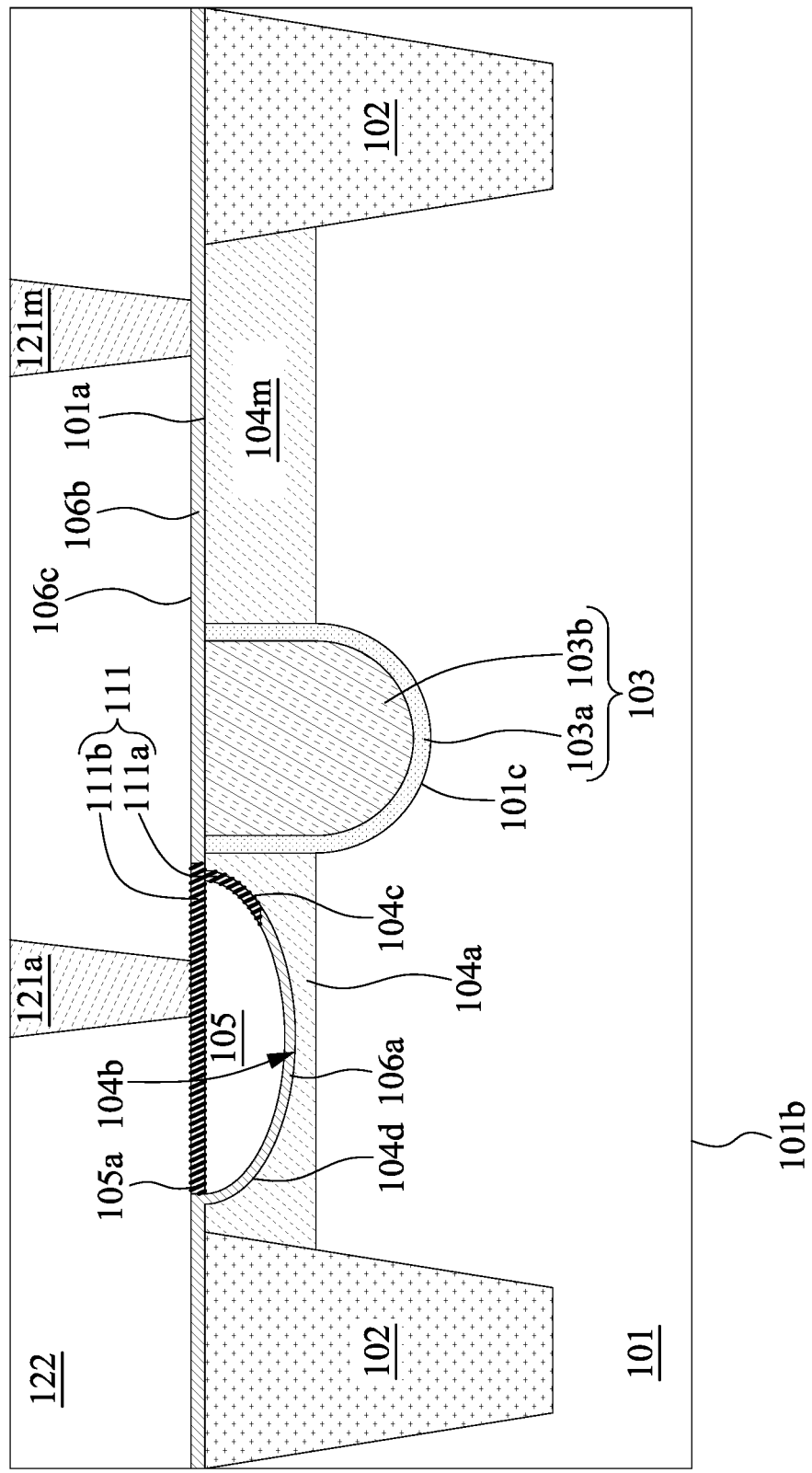
Figure 20:
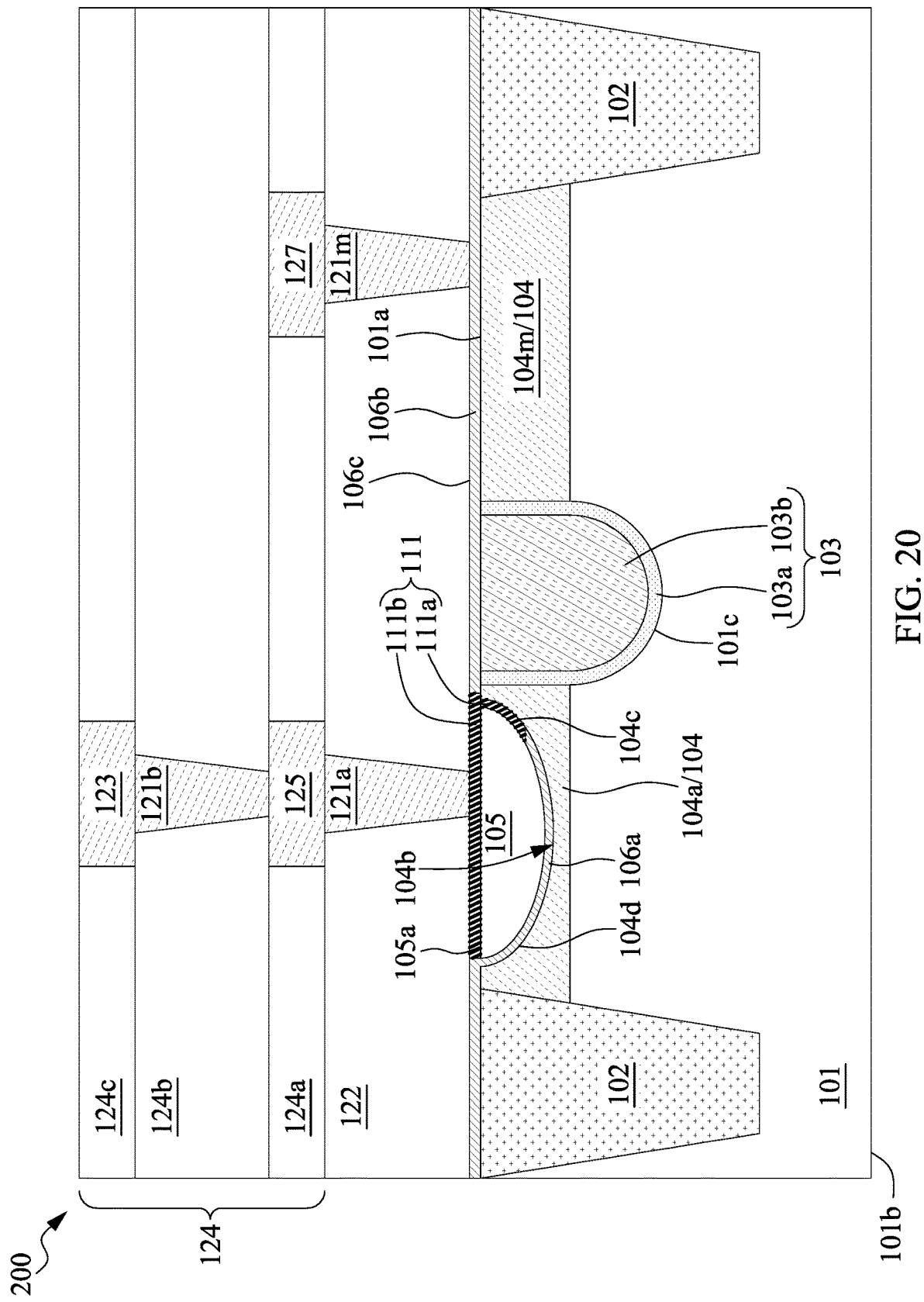

In some embodiments, referring to FIG. 19, the method S300 further includes forming a first dielectric layer 122 over the conductive layer 111, the first insulating layer 106a and the second insulating layer 106b. In some embodiments, the first dielectric layer 122 is formed by a chemical vapor deposition (CVD) process, a physical vapor deposition (PVD) process, an atomic layer deposition (ALD) process, a spin-coating process, or another applicable process. After the first dielectric layer 122 is formed, contacts 121a, 121m are formed within the first dielectric layer 122, and a planarization process may be selectively performed. The contact 121a is coupled to the second portion 111b of the conductive layer 111 and surrounded by the first dielectric layer 122. The contact 121m is coupled to the second active region 104m and surrounded by the first dielectric layer 122 and the second insulating layer 106b. In some embodiments, the planarization process includes a grinding process, a chemical mechanical polishing (CMP) process, an etching process, another applicable process, or a combination thereof. In some embodiments, the contacts 121a, 121m includes conductive material.

In some embodiments, the method S300 further includes forming a second dielectric layer 124 over the first dielectric layer 122. In some embodiments, a plurality of sub-layers 124a, 124b, 124c of the second dielectric layer 124 are formed over the first dielectric layer 122. In some embodiments, a material of the second dielectric layer 124 is different from a material of the first dielectric layer 122 such that an etching selectivity of the second dielectric layer 124 with respect to the first dielectric layer 122 is high during subsequent processing. In some embodiments, the second dielectric layer 124 is formed by a chemical vapor deposition (CVD) process, a physical vapor deposition (PVD) process, an atomic layer deposition (ALD) process, a spin-coating process, or another applicable process. After the second dielectric layer 124 is formed, a contact 121b, a capacitor 123 and a landing pad 125 is formed within the second dielectric layer 124 and over the conductive layer 111, and a bit line 127 is formed within the second dielectric layer 124 and over the second active region 104m. In some embodiments, a planarization process may be selectively performed. In some embodiments, the planarization process includes a grinding process, a chemical mechanical polishing (CMP) process, an etching process, another applicable process, or a combination thereof. In some embodiments, the capacitor 123 is coupled to the contacts 121a, 121b and the landing pad 125. In some embodiments, the bit line 127 is coupled to the contact 121m. In some embodiments, the contact 121m, the capacitor 123, the landing pad 125 and the bit line 127 include conductive material.

Figure 21:
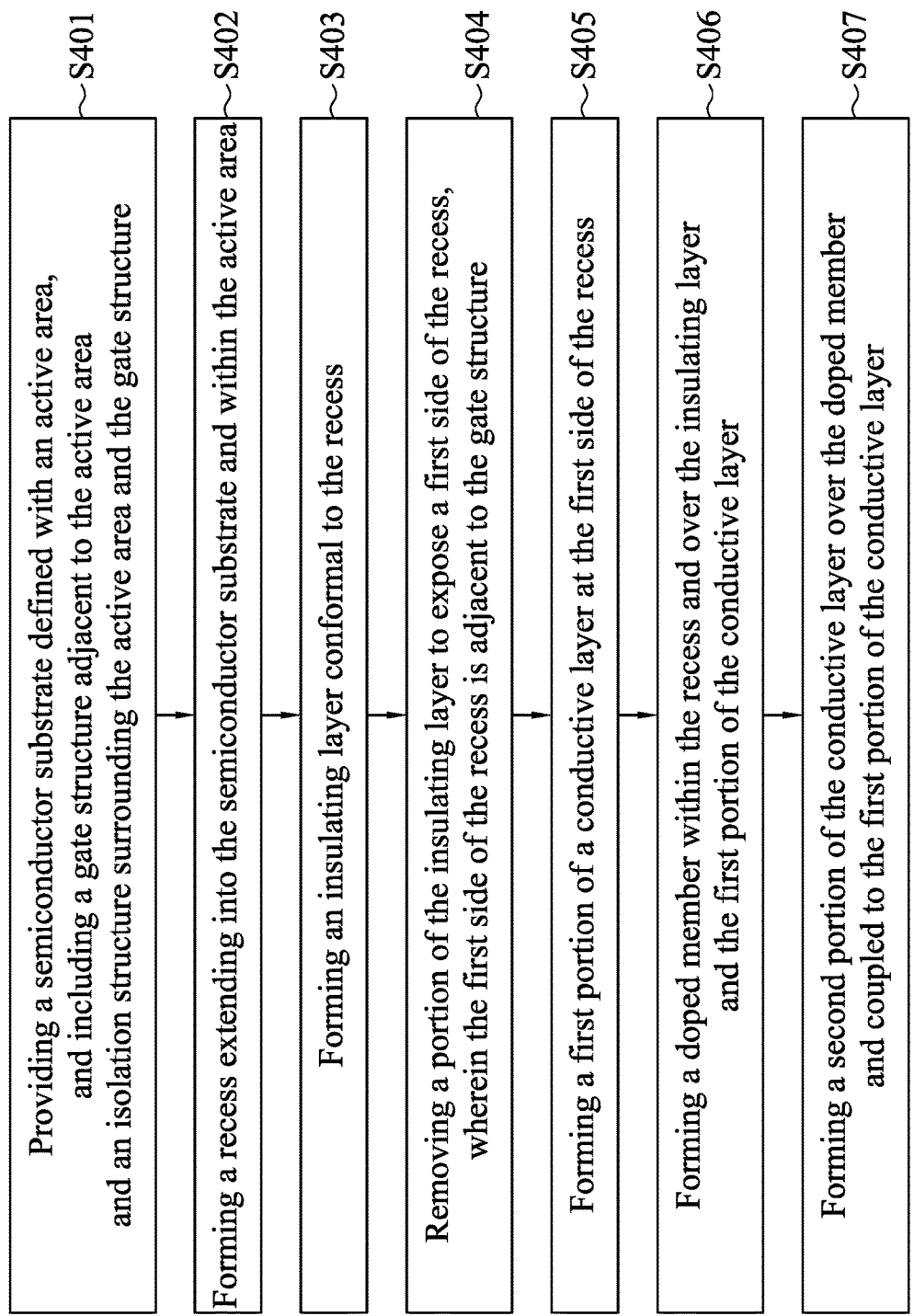
FIG. 21 is a flow diagram illustrating a method of manufacturing a memory device in accordance with some embodiments of the present disclosure.

FIG. 21 is a flow diagram illustrating a method S400 of manufacturing the first memory device 100 or the second memory device 200 in accordance with some embodiments of the present disclosure.

The method S400 includes a number of operations, and description and illustration are not deemed as a limitation to a sequence of the operations. The method S400 includes a number of steps (S401, S402, S403, S404, S405, S406, and S407).

In some embodiments, a semiconductor substrate is provided according to step S401 in FIG. 21. In some embodiments, the semiconductor substrate is defined with an active area, and includes a gate structure adjacent to the active area and an isolation structure surrounding the active area and the gate structure. In some embodiments, a recess extending into the semiconductor substrate and within the active area is formed according to step S402 in FIG. 21. In some embodiments, an insulating layer conformal to the recess is formed according to step S403 in FIG. 21.

In some embodiments, according to step S404 in FIG. 21, a portion of the insulating layer is removed to expose a first side of the recess, wherein the first side of the recess is adjacent to the gate structure. In some embodiments, a first portion of a conductive layer is formed on the first side of the recess according to step S405 in FIG. 21. In some embodiments, a doped member is formed within the recess and over the insulating layer and the first portion of the conductive layer according to step S406 in FIG. 21. In some embodiments, a second portion of the conductive layer is formed over the doped member and coupled to the first portion of the conductive layer according to step S407 in FIG. 21.

In an aspect of the present disclosure, a memory device is provided. The memory device includes a semiconductor substrate having a first surface and defined with an active area under the first surface; a gate structure adjacent to the active area and indented into the semiconductor substrate from the first surface; a doped member extending into the semiconductor substrate and surrounded by the active area; a conductive layer including a first portion extending into the semiconductor substrate from the first surface and a second portion disposed over the doped member and coupled to the first portion; and a first insulating layer disposed adjacent to the first portion of the conductive layer and between the doped member and the active area of the semiconductor substrate, wherein the first portion of the conductive layer is disposed between the gate structure and the doped member.

In some embodiments, the first portion of the conductive layer is in contact with the doped member. In some embodiments, the conductive layer is disposed over the active area. In some embodiments, the first portion of the conductive layer is coupled to the first insulating layer. In some embodiments, the doped member is disposed between the first insulating layer and the second portion of the conductive layer. In some embodiments, the doped member is surrounded by the first insulating layer and the conductive layer.

In some embodiments, the first portion of the conductive layer is substantially orthogonal to the second portion of the conductive layer. In some embodiments, the first insulating layer includes oxide. In some embodiments, the conductive layer covers the doped member. In some embodiments, the doped member includes polycrystalline silicon. In some embodiments, the gate structure includes a gate electrode and a gate oxide surrounding the gate electrode. In some embodiments, the memory device further includes a second insulating layer disposed over the gate structure.

In some embodiments, a top surface of the doped member is substantially lower than a top surface of the second insulating layer. In some embodiments, the first insulating layer and the second insulating layer include a same material. In some embodiments, a thickness of the first insulating layer is less than or equal to a thickness of the second insulating layer. In some embodiments, the first portion of the conductive layer is disposed between and coupled to the first insulating layer and the second insulating layer. In some embodiments, the second insulating layer is in contact with the gate structure.

In another aspect of the present disclosure, a memory device is provided. The memory device includes a semiconductor substrate having a first surface and defined with an active area under the first surface; a gate structure adjacent to the active area and indented into the semiconductor substrate from the first surface; an insulating layer disposed within the active area; and a conductive layer including a first portion extending into the active area and a second portion disposed over the insulating layer and the active area, wherein the first portion is coupled to and extends from the second portion, and the first portion contacts the insulating layer and the active area.

In some embodiments, the insulating layer is disposed under a doped member surrounded by the active area. In some embodiments, the first portion of the conductive layer is disposed between the doped member and the gate structure. In some embodiments, the doped member is surrounded by the conductive layer and the insulating layer.

In some embodiments, a length of the first portion of the conductive layer is less than a length of the insulating layer. In some embodiments, the conductive layer includes cobalt. In some embodiments, the memory device further includes a contact disposed over the conductive layer; and a capacitor electrically connected to the conductive layer through the contact.

In another aspect of the present disclosure, a method of manufacturing a memory device is provided. The method includes steps of providing a semiconductor substrate defined with an active area and including a gate structure adjacent to the active area and an isolation structure surrounding the active area and the gate structure; forming a recess extending into the semiconductor substrate and within the active area; and forming an insulating layer conformal to the recess. The method further includes removing a portion of the insulating layer to expose a first side of the recess, wherein the first side of the recess is adjacent to the gate structure; forming a first portion of a conductive layer on the first side of the recess; forming a doped member within the recess and over the insulating layer and the first portion of the conductive layer; and forming a second portion of the conductive layer over the doped member and coupled to the first portion of the conductive layer.

In some embodiments, the formation of the second portion of the conductive layer is performed after the formation of the first portion of the conductive layer and the formation of the doped member. In some embodiments, the method further includes forming an implanted region of the active area on the first side of the recess. In some embodiments, the implanted region is formed by implanting implants at an angle into the active area of the semiconductor substrate.

In some embodiments, the angle relative to a first surface of the semiconductor substrate ranges between 7 and 30 degrees. In some embodiments, the portion of the insulating layer is disposed over the implanted region. In some embodiments, the insulating layer is separated into a first segment disposed within the recess and a second segment disposed over the gate structure after the removal of the portion of the insulating layer. In some embodiments, a thickness of the portion of the insulating layer is substantially less than a thickness of the first segment of the insulating layer.

In some embodiments, the formation of the first portion of the conductive layer is performed after the formation of the insulating layer and the removal of the portion of the insulating layer. In some embodiments, the method further includes annealing the first portion of the conductive layer before the formation of the doped member. In some embodiments, the first portion of the conductive layer is annealed at a temperature between 650° C. and 800° C.

In conclusion, because an insulating layer is configured to limit a P-N junction area within an active area, a current must pass through a conductive layer coupled to the insulating layer, and P-N junction leakage can therefore be avoided. Overall performance of the memory device and process of manufacturing the memory device are thereby improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A memory device, comprising:
a semiconductor substrate having a first surface and defined with an active area under the first surface;
a gate structure adjacent to the active area and indented into the semiconductor substrate from the first surface;
a doped member extending into the semiconductor substrate and surrounded by the active area;
a conductive layer, including a first portion extending into the semiconductor substrate from the first surface and a second portion disposed over the doped member and coupled to the first portion; and
a first insulating layer disposed adjacent to the first portion of the conductive layer and between the doped member and the active area of the semiconductor substrate,
wherein the first portion of the conductive layer is disposed between the gate structure and the doped member.

2. The memory device according to claim 1, wherein the first portion of the conductive layer is in contact with the doped member.

3. The memory device according to claim 1, wherein the conductive layer is disposed over the active area.

4. The memory device according to claim 1, wherein the first portion of the conductive layer is coupled to the first insulating layer.

5. The memory device according to claim 1, wherein the doped member is disposed between the first insulating layer and the second portion of the conductive layer.

6. The memory device according to claim 1, wherein the doped member is surrounded by the first insulating layer and the conductive layer.

7. The memory device according to claim 1, wherein the first portion of the conductive layer is orthogonal to the second portion of the conductive layer.

8. The memory device according to claim 1, wherein the first insulating layer includes oxide.

9. The memory device according to claim 1, wherein the conductive layer covers the doped member.

10. The memory device according to claim 1, wherein the doped member includes polycrystalline silicon.

11. The memory device according to claim 1, wherein the gate structure includes a gate electrode and a gate oxide surrounding the gate electrode.

12. The memory device according to claim 1, further comprising:
a second insulating layer disposed over the gate structure;
wherein a top surface of the doped member is lower than a top surface of the second insulating layer; and
wherein the first insulating layer and the second insulating layer include a same material.

13. The memory device according to claim 12, wherein a thickness of the first insulating layer is less than or equal to a thickness of the second insulating layer;
wherein the first portion of the conductive layer is disposed between and coupled to the first insulating layer and the second insulating layer; and
wherein the second insulating layer is in contact with the gate structure.

14. A memory device, comprising:
a semiconductor substrate having a first surface and defined with an active area under the first surface;
a gate structure adjacent to the active area and indented into the semiconductor substrate from the first surface;
an insulating layer disposed within the active area; and
a conductive layer, including a first portion extending into the active area and a second portion disposed over the insulating layer and the active area, wherein the first portion is coupled to and extends from the second portion,
wherein the first portion of the conductive layer contacts the insulating layer and the active area.

15. The memory device according to claim 14, wherein the insulating layer is disposed under a doped member surrounded by the active area.

16. The memory device according to claim 15, wherein the first portion of the conductive layer is disposed between the doped member and the gate structure.

17. The memory device according to claim 15, wherein the doped member is surrounded by the conductive layer and the insulating layer.

18. The memory device according to claim 14, wherein a length of the first portion of the conductive layer is less than a length of the insulating layer.

19. The memory device according to claim 14, wherein the conductive layer includes cobalt.

20. The memory device according to claim 14, further comprising:
a contact disposed over the conductive layer; and
a capacitor electrically connected to the conductive layer through the contact.

* * * * *